United States Patent
Hayashi et al.

(10) Patent No.: US 6,247,548 B1
(45) Date of Patent: *Jun. 19, 2001

(54) MOVING APPARATUS WITH DRIVE POWER ASSISTING DEVICE AND MOVEMENT CONTROLLING METHOD

(75) Inventors: Toshiro Hayashi, Chiba; Yuichi Nanae; Hiroyoshi Hayashi, both of Saitama; Ichiro Katagiri, Tokyo; Naomasa Sato, Saitama; Tetsuo Endo, Miyagi; Hiroyuki Itoh, Tokyo, all of (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/000,030

(22) PCT Filed: May 23, 1997

(86) PCT No.: PCT/JP97/01740

§ 371 Date: May 21, 1998

§ 102(e) Date: May 21, 1998

(87) PCT Pub. No.: WO97/45316

PCT Pub. Date: Dec. 4, 1997

(30) Foreign Application Priority Data

May 24, 1996 (JP) .................................................. 8-153037
Dec. 27, 1996 (JP) .................................................. 8-357768

(51) Int. Cl.[7] .............................................. B62M 23/02

(52) U.S. Cl. ......................... 180/206; 180/220; 180/65.3

(58) Field of Search ................. 180/65.1, 65.2, 180/65.5, 170, 907, 205, 206, 207, 220

(56) References Cited

U.S. PATENT DOCUMENTS

| 3,921,741 | * | 11/1975 | Garfinkle et al. | 180/65.2 |
| 3,921,745 | * | 11/1975 | McCulloch et al. | 180/65.2 |
| 4,062,421 | * | 12/1977 | Weber | 180/205 |
| 4,122,907 | * | 10/1978 | Davidson et al. | 180/206 |
| 4,223,255 | | 9/1980 | Goldman et al. | 318/138 |
| 4,364,448 | * | 12/1982 | Ikuma | 180/206 |

(List continued on next page.)

FOREIGN PATENT DOCUMENTS

| 588375 | * | 5/1977 | (CH) | 180/207 |
| 598051 | * | 4/1978 | (CH) | 180/220 |
| 0 561 268 A1 | | 9/1993 | (EP) . | |
| 0 695 662 A1 | | 2/1996 | (EP) . | |
| 0 706 909 | | 4/1996 | (EP) . | |
| 2 264 676 | | 10/1975 | (FR) . | |

(List continued on next page.)

OTHER PUBLICATIONS

Patent Abstracts of Japan, vol. 1996, No. 06, Jun. 28, 1996 & JP 08 033303 (Yoshihiro Onishi, Feb. 2, 1996).

Primary Examiner—Frank Vanaman
(74) Attorney, Agent, or Firm—Frommer, Lawrence & Haug, LLP; William S. Frommer; Matthew K. Ryan

(57) ABSTRACT

A moving apparatus with a driving force assist mechanism traveled mainly by human power. This moving apparatus detects, in a non-contact manner, with respect to rotating portion such as traveling wheel, etc., rotation speed of the rotating portion to detect traveling state to deliver, from the driving force assist mechanism, assistant driving force corresponding to speed change information that a person who operates the moving apparatus intends to give on the basis of the detected traveling information to carry out traveling to thereby permit smooth traveling even in the case where traveling by only human power becomes difficult.

10 Claims, 36 Drawing Sheets

U.S. PATENT DOCUMENTS

| | | | | |
|---|---|---|---|---|
| 5,316,101 | * | 5/1994 | Gannon | 180/220 |
| 5,474,148 | * | 12/1995 | Takata | 180/206 |
| 5,602,448 | * | 2/1997 | Yaguchi | 180/206 |
| 5,603,388 | * | 2/1997 | Yaguchi | 180/65.2 |
| 5,730,243 | * | 3/1998 | Koike et al. | 180/170 |
| 5,910,714 | * | 6/1999 | Buchanan et al. | 180/206 |
| 5,922,035 | * | 7/1999 | Chen | 180/206 |

FOREIGN PATENT DOCUMENTS

| | | | |
|---|---|---|---|
| 2262490 | * | 6/1993 | (GB) ................................... 180/205 |
| 56-82686 | | 7/1981 | (JP) . |
| 62-18250 | | 11/1987 | (JP) . |
| 6-219368 | | 8/1994 | (JP) . |
| 7-149280 | | 6/1995 | (JP) . |
| 7-156856 | | 6/1995 | (JP) . |
| 7-172377 | | 7/1995 | (JP) . |
| 7-196070 | | 8/1995 | (JP) . |
| 7-215263 | | 8/1995 | (JP) . |
| 8-33302 | | 2/1996 | (JP) . |
| 8-268361 | | 10/1996 | (JP) . |
| 9-76983 | | 3/1997 | (JP) . |
| 9-123982 | | 5/1997 | (JP) . |

* cited by examiner

§ PWM SIGNAL WAVEFORM

| TRAVELING ROAD SURFACE STATE | KIND OF RELAY SECTION | ON /OFF |
|---|---|---|
| ASCENT | COIL CUT RELAY SECTION<br>RELAY SECTION FOR CHARGE CIRCUIT | ON<br>OFF |
| INERTIA (FLAT) | COIL CUT RELAY SECTION<br>RELAY SECTION FOR CHARGE CIRCUIT | OFF<br>OFF |
| DESCENT | COIL CUT RELAY SECTION<br>RELAY SECTION FOR CHARGE CIRCUIT | OFF<br>ON |

DISCHARGE CHARACTERISTICS OF VARIOUS BATTERIES

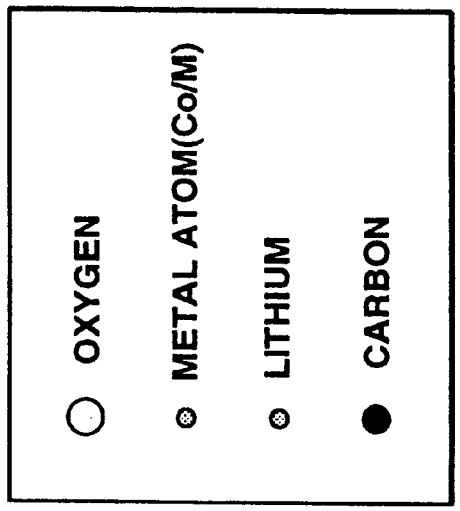
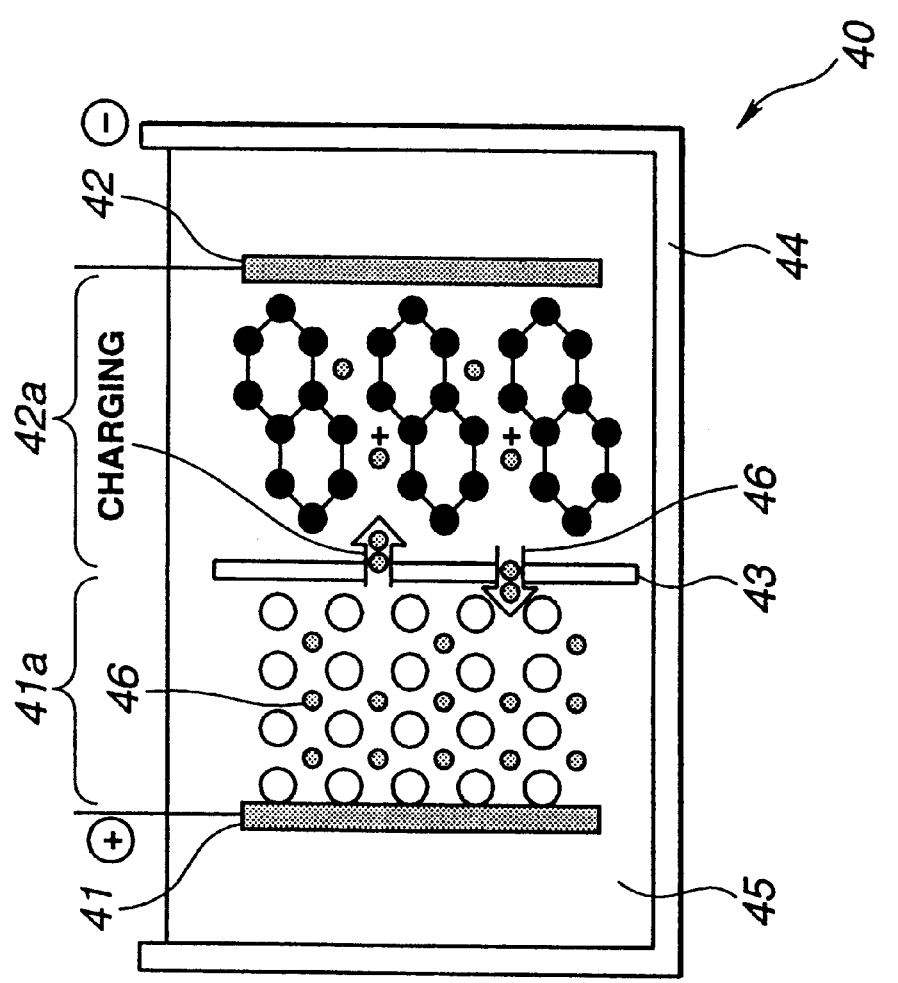
FIG.32

| MODE | STATE |
|---|---|
| INITIAL STATE 0 | : POWER OFF (OR BATTERY DEAD) STATE → SINCE MOTOR IS IN FREE STATE, DRIVER CAN MOVE BICYCLE BY HAND, OR RIDE THEREON AS ORDINARY BICYCLE. |
| BRAKE STATE 1 | : BRAKE STATE → BRAKE SENSOR IS CAUSED TO BE PREFERENTIAL TO OTHER SENSORS TO ALLOW ASSIST QUANTITY TO BE 0. AT THIS TIME, ASSIST QUANTITY IS CAUSED TO BE NEGATIVE (MOTOR IS ROTATED IN REVERSE DIRECTION) TO THEREBY UTILIZE MOTOR AS ELECTROMAGNETIC BRAKE TO PERMIT ENHANCEMENT OF BRAKING EFFECT. |
| STOP STATE 2 | : STOP STATE → SINCE MOTOR IS IN FREE STATE, DRIVER CAN FREELY MOVE BICYCLE BY HAND. |
| ACCELERATION TRAVELING STATE 3 | : ACCELERATION STATE WHERE CRANK IS SYNCHRONIZED (LESS THAN 15km/h) → 1/2 ASSIST (ASSIST OF ONE HALF OF NECESSARY WORK LOAD). |
| 4 | : ACCELERATION STATE WHERE CRANK IS SYNCHRONIZED (15~24km/h) → GRADUAL DECREASE OF ASSIST RATIO FROM 1/2 ASSIST |
| 5 | : ACCELERATION STATE WHERE CRANK IS SYNCHRONIZED (MORE THAN 24km/h) → ASSIST OFF. MOTOR FREE |
| INERTIA TRAVELING STATE 6 | : STATE WHERE CRANK IS NOT SYNCHRONIZED (INERTIA TRAVELING) STATE → ASSIST OFF IRRESPECTIVE OF SPEED. MORE FREE |
| CONSTANT TRAVELING STATE 7 | : CONSTANT SPEED STATE WHERE CRANK IS SYNCHRONIZED → ASSIST SIMILAR TO THAT AT TIME OF ACCELERATION |
| DECELERATION TRAVELING STATE 8 | : DECELERATION STATE WHERE CRANK IS SYNCHRONIZED → ASSIST SIMILAR TO THAT AT TIME OF ACCELERATION |
| DESCENDING TRAVELING STATE 9 | : STATE WHERE CRANK IS NOT SYNCHRONIZED, DESCENDING SLOPE → ASSIST OFF IRRESPECTIVE OF SPEED. MOTOR FREE |
| 10 | : ACCELERATION STATE WHERE CRANK IS SYNCHRONIZED, DESCENDING SLOPE → ASSIST OFF IRRESPECTIVE SPEED. MOTOR FREE |
| ASCENDING TRAVELING STATE 11 | : STATE WHERE CRANK IS SYNCHRONIZED, ASCENDING SLOPE → ASSIST QUANTITY CORRESPONDING TO SPEED IS MULTIPLIED BY COEFFICIENT BY ANGLE OF SLOPE |
| 12 | : STATE WHERE CRANK IS SYNCHRONIZED, STEEP ASCENDING SLOPE → COEFFICIENT BY ANGLE OF SLOPE BECOMES LARGE AT THIS TIME, ASSIST QUANTITY IS LIMITED BY CHARACTERISTIC OF MOTOR.<br>※ IN CASE OF ASCENDING SLOPE, EVEN IF CRANK IS NOT TEMPORARILY SYNCHRONIZED, ASSIST OF QUANTITY SUCH THAT MOTOR (WHEEL) IS NOT STOPPED CONTINUED. |

FIG.44

MOVING APPARATUS WITH DRIVE POWER ASSISTING DEVICE AND MOVEMENT CONTROLLING METHOD

This invention relates to a moving apparatus provided with a drive wheel driven by human power (strength) and a movement control method for such a moving apparatus, and more particularly to a moving apparatus provided with a driving force assist device using chargeable secondary battery as the drive source and adapted to carry out traveling by making use of the drive force from the drive force assist device in addition to human power in dependency upon the traveling state, and a movement control method for such a moving apparatus.

Hitherto, as a moving apparatus adapted so that the drive wheel is driven by human power to carry out traveling, bicycles are widely used.

In a bicycle, a person who operates the bicycle rides on the saddle to rotate the crank through the pedals by leg-power of the driver (operator) or force applied onto the pedal by the driver (hereinafter referred to as step-on force as occasion may demand) to transmit, to the drive wheel, rotation of the crank through the drive force transmission mechanism such as chain, etc. so that traveling is carried out.

In such cases that bicycle adapted for carrying out traveling only by human power as mentioned above comes to the ascending slope (rising hill), it would become difficult to carry out traveling only by human power. In view of the above, there has been proposed a bicycle provided with driving force assist device (unit) driven by the electric motor which assists leg-power or step-on force of the driver. Such a bicycle comprises, as shown in FIG. 46, a torque sensor 1 for detecting leg-power (step-on force) of the driver, a rotation sensor 2 for confirming rotation of the pedal, and a control unit 3 for controlling a driving force assist unit 4 on the basis of detection outputs of the torque sensor 1 and the rotation sensor 2. The control unit 3 detects of detection outputs of the torque sensor 1 and the rotation sensor 2. The control unit 3 detects the number of rotations of the pedal by detection output from the rotation sensor 2, and detects leg-power (step-on force) of the driver on the basis of detection output from the torque sensor 1, whereby when it is detected that the number of rotations of the pedal is below a predetermined value and the step-on force is a predetermined value or more, it drives the driving force assist unit to conduct a control so as to apply driving force which is one half (½) of the step-on force to the drive wheel.

Meanwhile, since torque sensors used in the conventionally proposed bicycles with the driving force assist mechanism are torque sensors using the mechanical elements, the configuration thereof is complicated and they are difficult to be assembled into the crank shaft or chain, or the main shaft of the drive wheel. Moreover, since such torque sensors using the mechanical elements are large-sized and are heavy in weight, a portion of the step-on force of the driver is consumed and a portion of the driving force (power) of the electric motor is consumed. For this reason, the traveling efficiency is not good.

In addition, the torque sensors using the mechanical elements have delay in detection of the rotation torque. As a result, it is difficult to quickly detect leg-power (step-on force) of the driver in dependency upon the traveling state to quickly drive the driving force assist unit in dependency upon the traveling state.

OBJECTS OF THE INVENTION

An object of this invention is to provide a novel moving apparatus and a movement control method for such a moving apparatus which can eliminate or solve the problems of the conventionally proposed bicycles with driving force assist mechanism.

Another object of this invention is to provide a moving apparatus with driving force assist mechanism and a movement control method for such a moving apparatus in which consumption of the drive source is reduced so that efficient traveling can be achieved.

A further object of this invention is to provide a moving apparatus and a movement control method for such a moving apparatus which can quickly assist suitable driving force when assistance of the driving force is required.

A still further object of this invention is to provide a moving apparatus and a movement control method for such a moving apparatus in which light weight is realized and consumption efficiency of driving force is enhanced.

A moving apparatus proposed in order to attain the objects as described above comprises a manually operated drive wheel, and a driving force assist unit for additionally applying driving force to the drive wheel in addition to human power in dependency upon traveling state. This moving apparatus comprises a traveling information detecting mechanism for detecting, in a non-contact manner with respect to a rotating portion, rotation speed of the rotating portion to detect traveling state, a driving force assist mechanism for applying, to the drive wheel, a driving force corresponding to speed change information that a person who operates the moving apparatus intends to provide, which is detected on the basis of traveling information detected by the traveling information detecting mechanism, and an electric power source for driving the driving force assist mechanism.

The moving apparatus according to this invention detects by the traveling information detecting mechanism that traveling only by human power becomes difficult to drive the driving force assist mechanism in dependency upon its detection output to thereby assist the driving force, thus permitting realization of smooth traveling.

The traveling information detecting mechanism constituting the moving apparatus according to this invention detects rotation speed of the rotating portion in a non-contact manner with respect to the rotating portion to detect traveling state. Accordingly, it is possible to suppress consumption of driving force (power) of the rotating portion. Further, since the driving force assist mechanism assists, on the basis of speed change information that a person who operates the moving apparatus intends to give, which is obtained from the traveling information detecting mechanism, driving force corresponding to the speed change information, it is possible to quickly assist a portion of driving force for movement that the person who operates the moving apparatus provides. Thus, smooth traveling can be ensured.

Moreover, since an electric motor constituting the driving force assist mechanism of the moving apparatus according to this invention is adapted so that a rotor is integrally attached with respect to the traveling wheel (drive wheel), it is possible to directly rotate the traveling wheel. Thus, loss of the driving force can be reduced.

Further, in the above-mentioned electric motor, radiating means for radiating heat that the drive coil of the stator produces is provided at the stator side.

Furthermore, in the moving apparatus according to this invention, there is provided a display unit for carrying out a remaining traveling distance display of the moving apparatus on the basis of voltage of the secondary battery which drives the electric motor constituting the driving force assist mechanism, thereby making it possible to easily grasp the travelable distance.

In addition, in the moving apparatus according to this invention, in the case where the state of the road surface on which this moving apparatus moves has a necessity of assisting a portion of driving force for moving the moving apparatus, the electric motor is caused to be driven. On the other hand, in the case where the state of the road surface on which the moving apparatus moves has no necessity of assistant driving force for moving the moving apparatus, the electric motor is caused to function as a generator, thereby making it possible to reduce the power consumption of the secondary battery. This permits the moving apparatus to travel long distance.

Still further objects of this invention and more practical merits obtained by this invention will become more clear from the description of the embodiments which will be described below.

BRIEF DESCRIPTION OF THE DRAWINGS

FIG. 32 is a view showing the principle of operation of a lithium ion battery.

FIG. 44 is a view for explaining timing of the supply of the assist driving force from the motor shown in FIG. 43.

DETAILED DESCRIPTION OF CERTAIN PREFERRED EMBODIMENTS OF THE INVENTION

Figure 1:
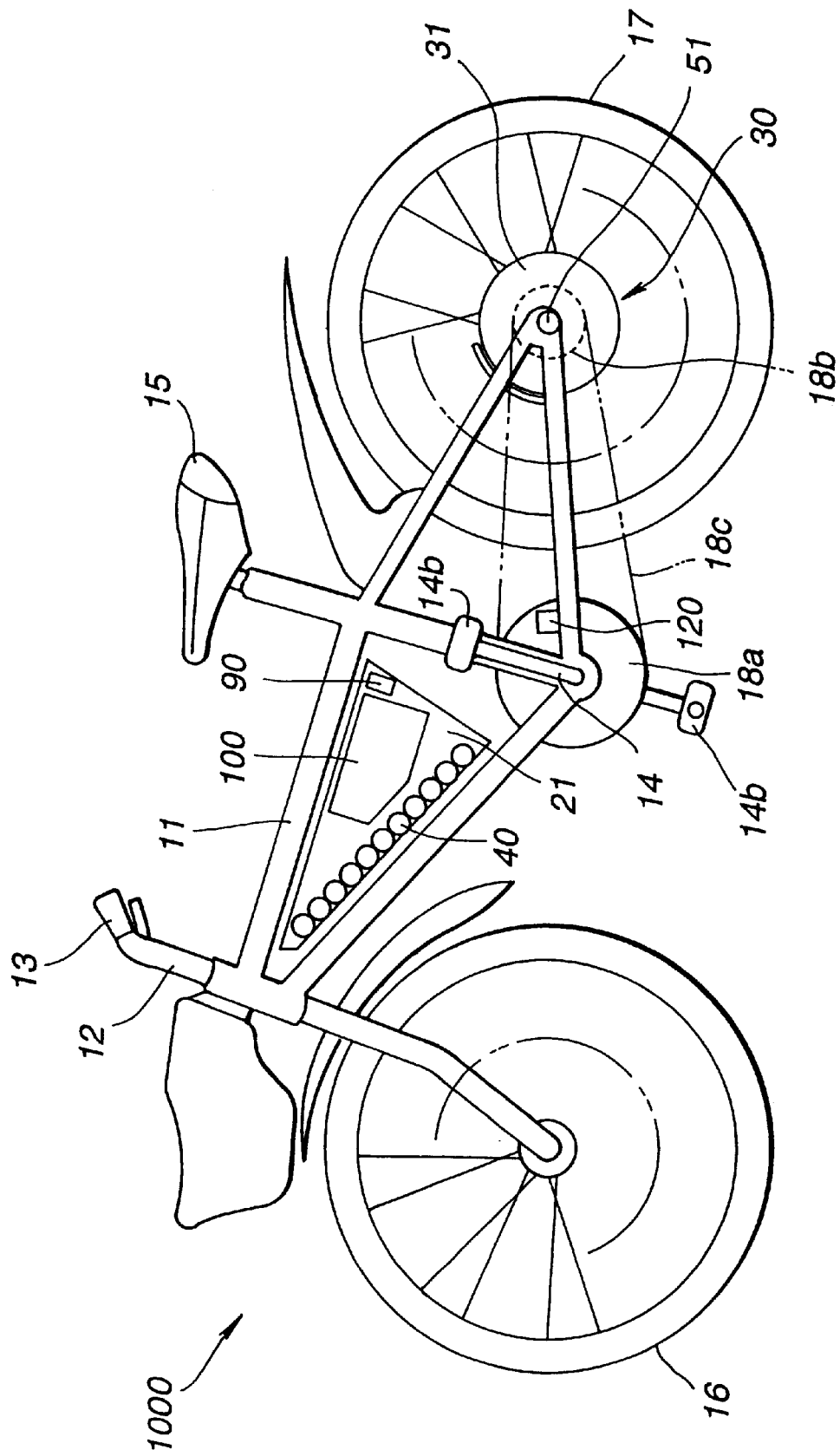
FIG. 1 is a side view showing a motor-operated bicycle according to this invention.

This invention will be described below by taking the example applied to, as a moving apparatus, a motor-operated bicycle moved by human power in an ordinary traveling state and moved in a state where the driving force of an electric motor formed of a drive force assist mechanism which is added as need arises.

A motor-operated bicycle according to this invention comprises, similarly to the well known bicycle, a frame 11 which is generally of a triangular shape, a handle 12 for controlling traveling direction, grip portions 13 for operating the handle 12, a crank 14 which is rotated by the driver, a saddle 15 on which the driver sits, a front wheel 16 changed in a traveling direction by operation of the handle 12, a rear wheel 17 serving as a drive wheel rotated by undergoing rotational force of the crank 14, a first gear 18$a$ rotating in one body with the crank 14, a second gear 18$b$ rotating in one body with the rear wheel, and a chain 18$c$ wound between first and second gears 18$a$, 18$b$, which transmits rotational force of the crank 14 to the rear wheel 17. The crank 14, the front wheel 16, the rear wheel 17, the first gear 18$a$ and the second gears 18$b$ are rotating parts (portions) at the time of traveling. In this bicycle, when driver steps on pedals 14$b$ attached at the front end of the crank 14, the crank 14 is rotated. As a result, the rotational force of this crank 14 is transmitted to the rear wheel 17 through the first gear 18$a$, the chain 18$c$ and the second gear 18$b$. Thus, traveling of the motor-operated bicycle is achieved.

In this example, the first gear 18$a$ is formed so as to have a greater diameter as compared to the second gear 18$b$ to thus increase the rotational speed of the rear wheel 17 as compared to the rotational speed of the crank 14. In this motor-operated bicycle, as shown in FIG. 1, a driving force assist mechanism 30 is assembled at the rear wheel 17.

Moreover, an attachment plate 21 is attached at the frame 11, and a chargeable secondary battery 40 which supplies electric power for driving the driving force assist mechanism 30 is detachably attached through the attachment plate 21. Further, a traveling information detecting unit 100 for detecting speed of the portions rotating at the time of traveling to detect the traveling state is attached at the attachment plate 21. In addition, an inclination state detection sensor 90 for detecting the inclination state ranging from the front wheel 16 side toward the rear wheel 17 side is attached at the attachment plate 21.

The secondary battery 40 attached at the attachment plate 21 can be charged by 100 V of commercial power supply (source) for home. In the state where the driving force assist mechanism 30 assists leg-power (step-on force) of the driver, the bicycle 1000 of this embodiment can travel up to the distance of about 70 km. The secondary battery 40 can be fully charged in about four hours as an example. The battery capacity thereof is about 28.8 V-5 Ah (144 Wh). As the secondary battery 40, a secondary battery of light weight of the order of 1.3 kg is used.

The motor-operated bicycle to which the driving force assist mechanism 30 and the secondary battery 40 are attached as stated above can be formed so that the entire weight becomes equal to about 20 kg.

Figure 2:
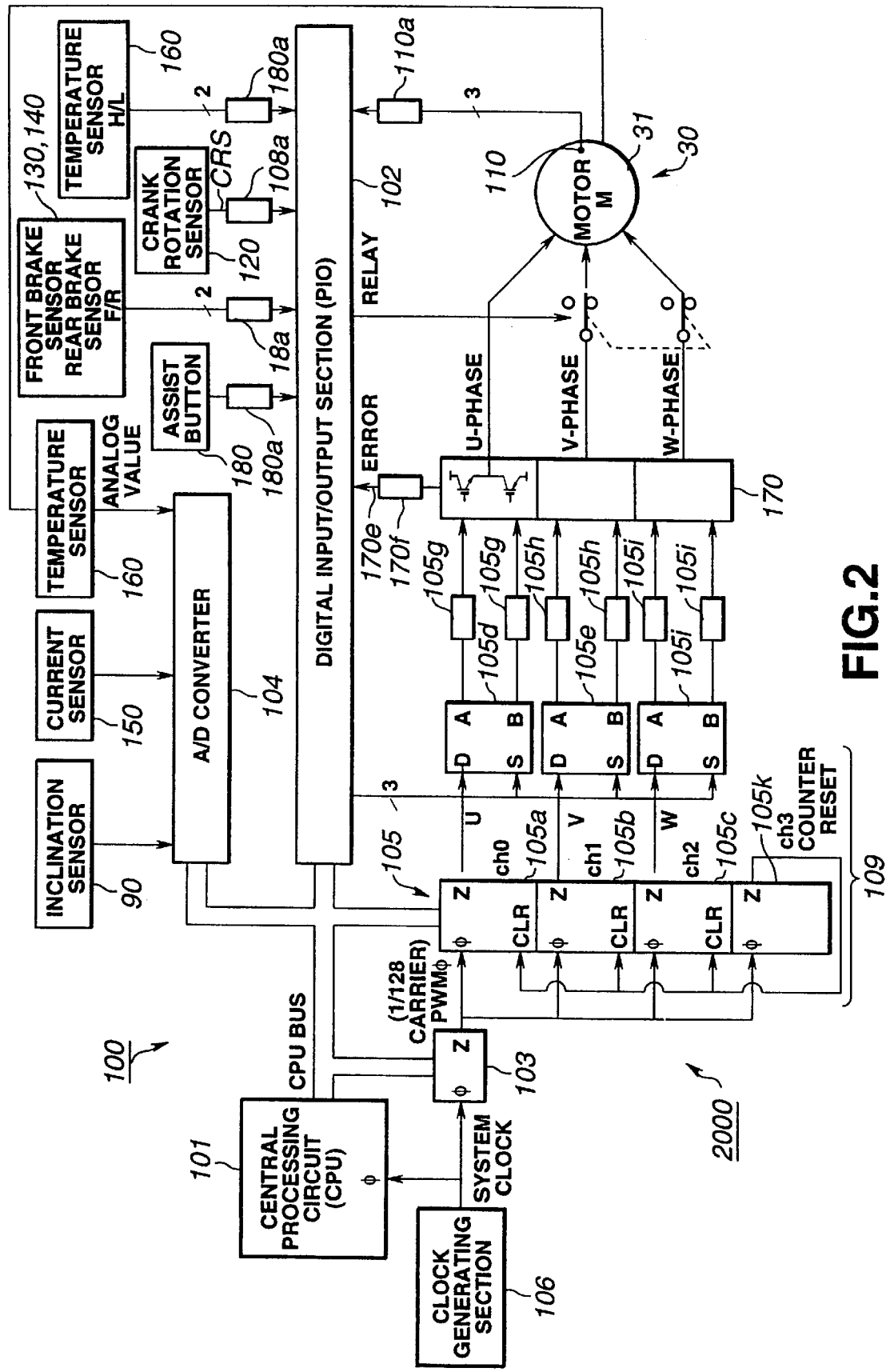
FIG. 2 is a block circuit diagram showing the control system of the motor-operated bicycle.

A traveling control unit 2000 for controlling the entirety of this bicycle 1000 has a configuration as shown in FIG. 2. The traveling control unit 2000 carries out a control as shown in FIG. 3.

Figure 3:
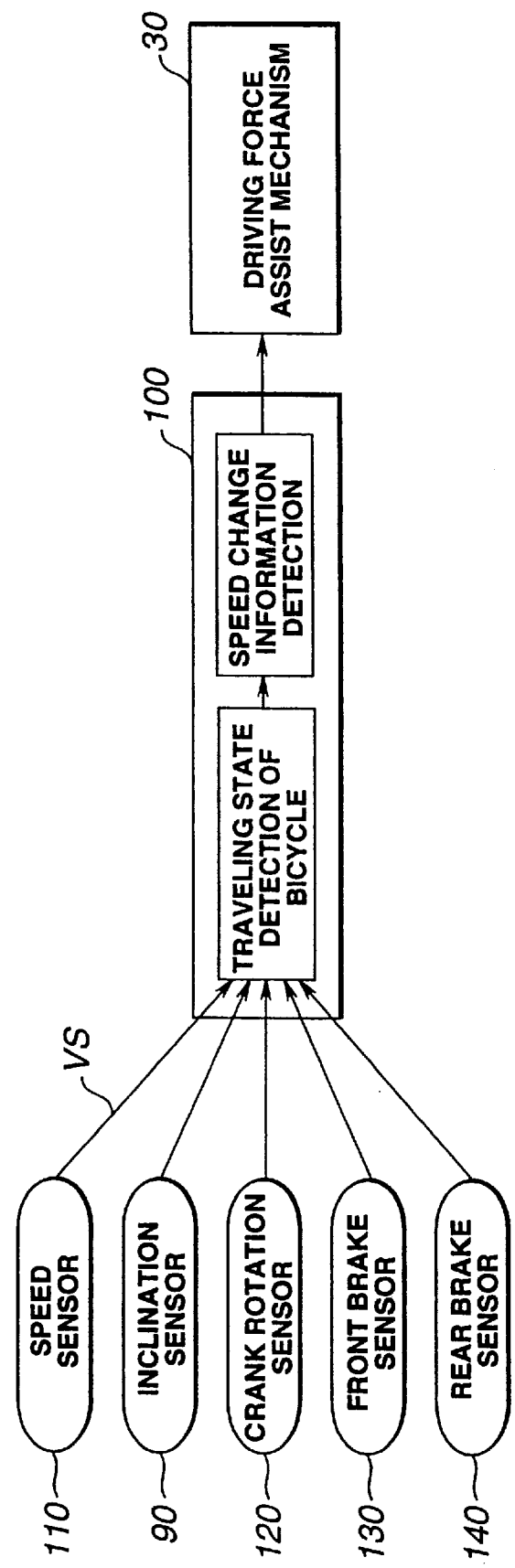
FIG. 3 is a block diagram for explaining the relationship between traveling information detecting unit and driving force assist mechanism.

Namely, in the traveling control unit 2000, as shown in FIG. 3, the traveling information detecting unit 100 determines the traveling state of the motor-operated bicycle on the basis of respective signals from a speed sensor 110, the inclination (state) sensor 90, a crank rotation sensor 120, a front brake sensor 130 and a rear brake sensor 140. Further, the traveling information detecting unit 100 detects acceleration information which is speed change information on the basis of speed (velocity) signal VS from the speed sensor 110 to drive and control the driving force assist mechanism 30 on the basis of the speed change information to carry out assistance (assist operation) of the driving force such that the traveling state that the driver desires can be provided.

To achieve this, the traveling power (P) at a current traveling time point is first calculated from the speed information and inclination information to determine, from the traveling power information and the acceleration information, assistant driving force (power) applied to the rear wheel 17 (the drive wheel) by the driving force assist mechanism 30.

Moreover, while traveling power (P) in the current traveling state can be calculated from speed information and inclination information, the traveling power (P) calculated here is only the force (power) required for allowing the bicycle 1000 to travel at that speed at that point in time.

In view of the above, as described above, such an approach is employed to determine the acceleration information on the basis of speed signal VS to add acceleration traveling power value which is the amount of traveling power based on the above-mentioned acceleration information and constant speed (velocity) traveling power value which is the calculated value of traveling power, thereby making it possible to carry out assistance of a driving force (power) such that a traveling state that the driver desires can be provided from the driving force assist mechanism 30 to the bicycle 1000.

In a more practical sense, at very short travel time, acceleration information is calculated from the speed information, thereby making it possible to judge whether the driver intends to accelerate or decelerate the bicycle. For example, when the driver intends to accelerate the bicycle, the assist quantity of driving force applied from the driving force assist mechanism 30 is increased. Moreover, for example, even in the case where the same acceleration information is given, when traveling speed at that time is low, assist quantity of driving force is increased, while when it is high, assist quantity of driving force is reduced to enhance traveling ability at the time of low speed. Further, when the degree of inclination of the road surface is great, assist quantity of that driving force is increased even in the decelerating state where acceleration information indicates minus direction, thereby making it possible to enhance traveling ability at a rising hill.

In order to determine assist quantity of driving force by using speed information, inclination information and acceleration information as stated above, there may be employed an approach to prepare calculation formulas corresponding to the circumstances (states) such as the circumstances (states) obtained from the speed information, the inclination information and/or acceleration information to individually carry out calculations by the calculation formulas corresponding to those circumstances, or there may be employed an approach to store, in advance, calculated data in the Table to determine assist quantity of driving force on the basis of table data corresponding to respective circumstances.

Initially, referring to FIG. 2, a central processing circuit 101 constituting the traveling information detecting unit 100 is connected to a digital input/output section 102, a counter 103, an analog/digital (A/D) converter 104, and a pulse width modulation (PWM) data section 105 of a PWM signal generation logic circuit 109 through bus. A clock generating section 106 delivers a system clock for reference of the system operation to the counter 103 and the central processing circuit 101. The analog/digital converter 104 receives analog signals from the inclination sensor 90, a current sensor 150 and a temperature sensor 160 to convert them into digital signals. The counter 103 delivers PWM clock φ (1/128 carrier) to the PWM data section 105 on the basis of the system clock from the clock generating section 106. The PWM data section 105 has counter units 105a to 105f, and 105k of channels ch0—channel ch3, wherein the channel ch3 has counter reset (function) for clearing values of the channel ch0—channel ch2. The counter units 105a to 105c of the channel ch0—the channel ch2 of the PWM data section 105 are connected to a driver power stage 170 of a three-phase motor 31 which is an electric motor constituting the driving force assist mechanism 30 through the counter units 105d, 105e and 105f, and photo-couplers 105g, 105h and 105i for isolation. This power stage 170 allows respective U-phase, V-phase and W-phase of the three-phase motor 31 to undergo PWM control to suitably energize them. A driving force assist button 180, the front brake sensor 130, the rear brake sensor 140, the crank rotation sensor 120 and a temperature sensor 160, etc. are connected to the digital input/output section 102 through photo-couplers 180a for isolation. The speed sensor 110 of the three-phase motor 31 is connected to the digital input/output section 102 through a photo-coupler 110a.

Figure 4:
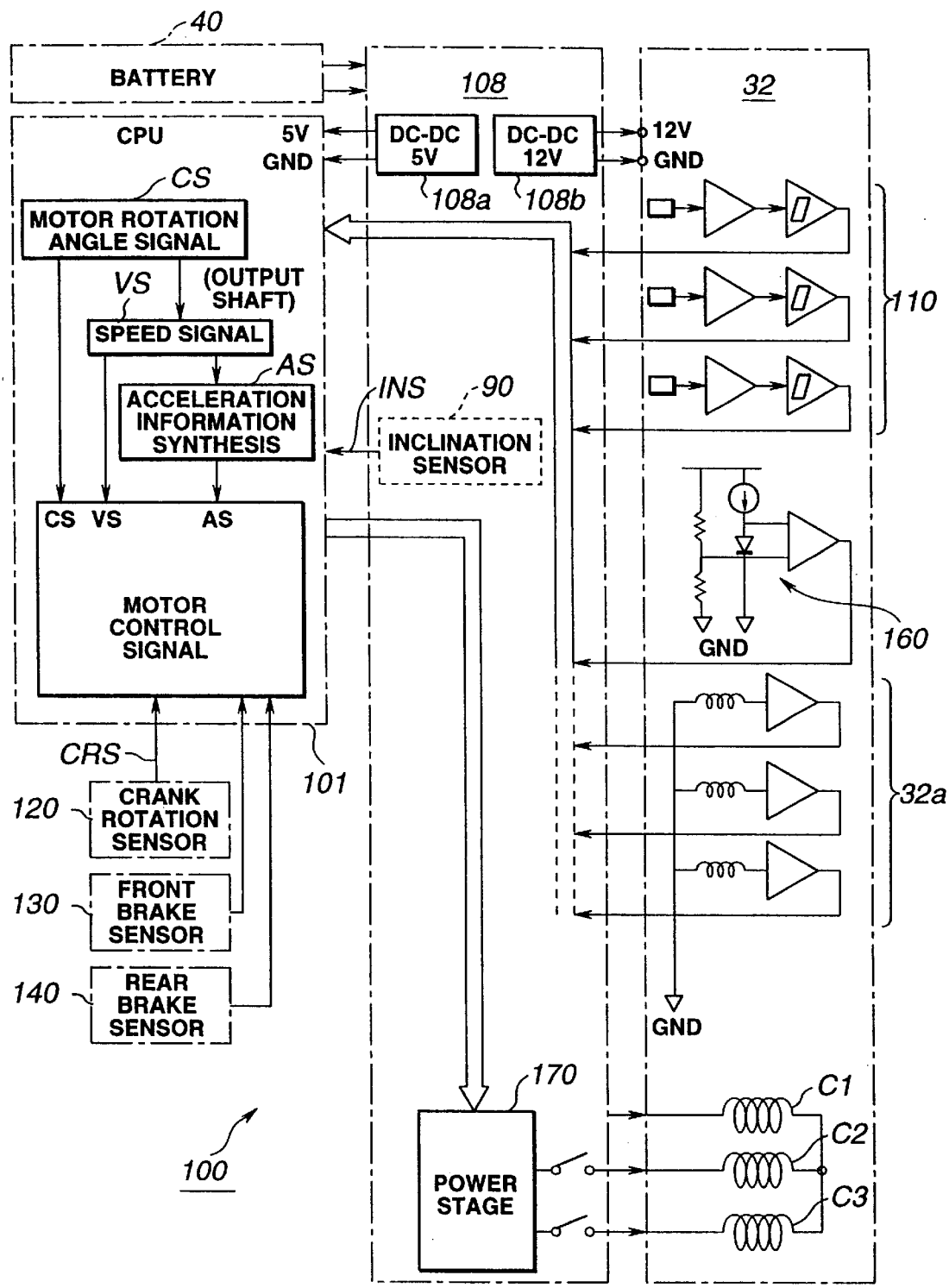
FIG. 4 is a block diagram showing the control system of motor.

The circuit block diagram of FIG. 4 is the diagram further including the secondary battery 40 with respect to the circuit block diagram of FIG. 2, and shows the secondary battery 40, the traveling information detecting unit 100, and a motor board (printed board for motor circuitry) 32, etc. The traveling information detecting unit 100 includes the central processing circuit 101 and a main board 108.

With respect to the central processing circuit 101, the speed sensor 110, the inclination sensor 90, the crank rotation sensor (referred to as crank shaft speed sensor as occasion may demand) 120, the front brake sensor 130 and the rear brake sensor are related thereto. The inclination sensor 90 is disposed at the main board 108. A DC-DC converter 108a sets voltage from the secondary battery 40 to 5V to deliver it to the central processing circuit 101. In addition, a DC-DC converter 108b of the main board 108 has a function to set voltage from the secondary battery 40 to 12 V to send (deliver) it to the motor board 32 side.

Three speed sensors 110 shown in FIG. 1 are provided at the motor board 32 although explanation will be given later, and has a function to send motor rotation angle signal CS to the central processing circuit 101 side. The central processing circuit 101 has a function to detect speed signal VS of the rotor of the motor on the basis of the motor rotation angle signal CS, and to generate acceleration information AS as speed change information from the speed signal VS.

The motor board 32 includes the speed sensors 110 and the temperature sensor 160 which have been described above, an induced voltage detecting section 32a, and three drive coils C1 to C3. The power stage 170 of the main board 108 delivers drive voltage to these three coils C1, C2, C3 (respectively corresponding to the U-phase, the V-phase and the W-phase).

In addition, the power stage 170 shown in FIG. 2 has a function to send (deliver) an error signal 170e to the digital input/output section 102 through a photo-coupler 170f for isolation. The central processing circuit 101 is operative so that when abnormal state takes place in the power stage 170, it receives the above-mentioned error signal 170e to immediately stop the three-phase motor 31.

The driving force assist button 180 shown in FIG. 2 is a push-switch which is caused to undergo ON/OFF operation by the driver. When the driving force assist button 180 is turned ON, there results the assist mode. For example, when driver walks while pushing the motor-operated bicycle 1000 shown in FIG. 1, the three-phase motor 31 is caused to be operative at the time of necessity, such as, for example, when the bicycle rides over the offset, etc. to apply assistant power to the rear wheel 17 of FIG. 1 to carry out assist operation. For example, when the driver walks while pushing the motor-operated bicycle 1000, the motor 31 can be operated only when the speed of the bicycle is less than 2.5 km/h. By carrying out an assist operation in this way, the driver can lightly push the motor-operated bicycle as need arises even if an obstruction is in the driver's way.

The front brake sensor 130 and the rear brake sensor 140 shown in FIG. 2 will now be described.

Figure 5:
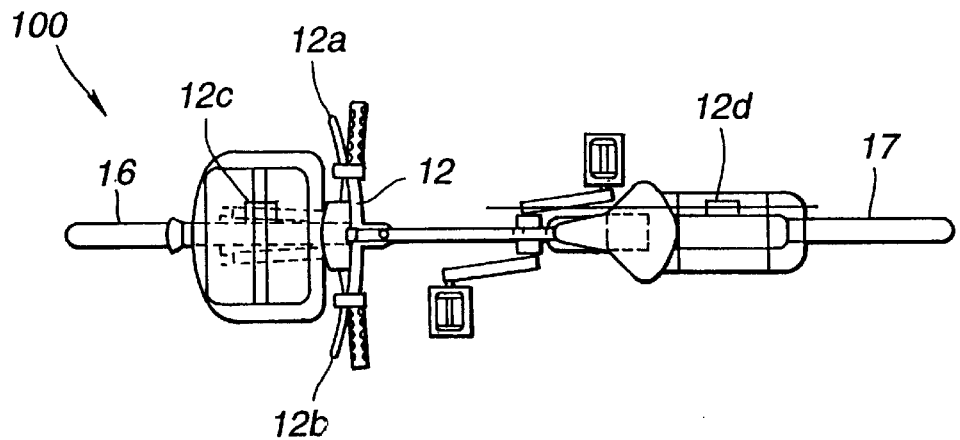
FIG. 5 is a plan view of the motor-operated bicycle according to this invention.

FIG. 5 is a plan view of the motor-operated bicycle 1000 of FIG. 1, wherein a front brake lever 12a and a rear brake lever 12b are provided at the handle 12. The front brake lever 12a serves to operate a front brake 12c which stops rotation of the front wheel 16, and the rear brake lever 12b serves to operate a rear brake 12d of the rear wheel 17. These front and rear brakes 12c and 12d function as brake means for carrying out brake (braking) operation of the motor-operated bicycle 1000.

Figure 6:
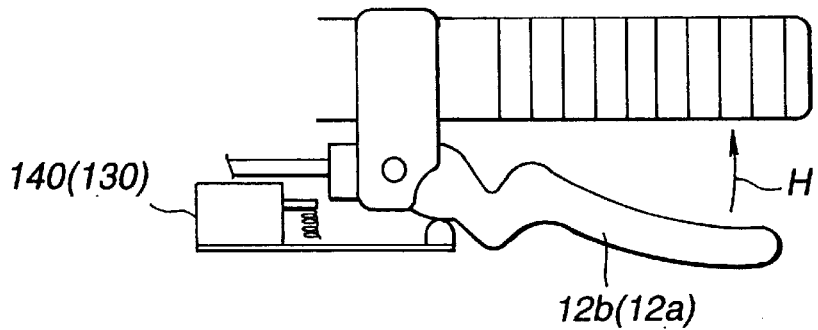
FIG. 6 is a plan view showing brake portion of the motor-operated bicycle.

As shown in FIG. 6, a rear brake sensor 140 like micro switch is provided, e.g., at the rear brake lever 12b. Driver operates the lever 12b in the direction indicated by arrow H, whereby the rear brake sensor 140 is turned ON. On the other hand, when the driver releases the rear brake lever 12b, the brake sensor 140 is turned OFF.

When the driver operates the front brake 12a in a manner similar to the above, the front brake sensor 130 is turned ON. When he releases the front brake lever 12a, the front brake sensor 130 is turned OFF. As stated above, the central processing circuit 101 of FIG. 2 judges on the basis of brake signal of the front brake sensor 130 or the rear brake sensor 140 whether the driver has operated the front brake 12c or the rear brake 12d by using the front brake lever 12a or the rear brake lever 12b. Namely, ON signals of these sensors 130, 140 are detected, whereby the central processing circuit 101 can judge whether the driver intends to stop the motor-operated bicycle 1000.

Figure 7:
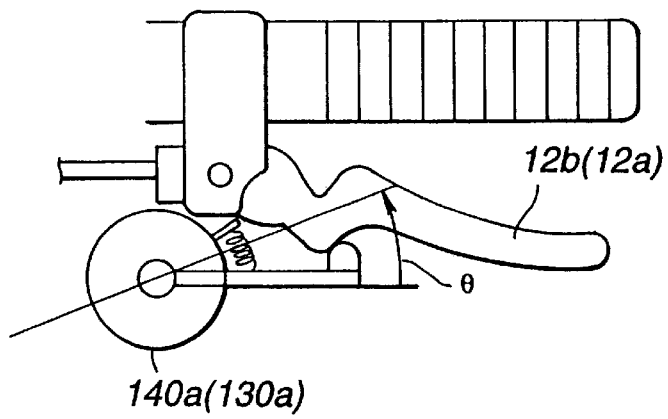
FIG. 7 is a plan view showing another example of brake constituting the motor-operated bicycle according to this invention.

Additionally, FIG. 7 shows another example of the front brake sensor and the rear brake sensor. In the example shown in FIG. 7, potentiometers 130a, 140a are used in place of the micro switch. The potentiometers 130a, 140a output brake signals of magnitude corresponding to angle θ of the lever.

Figure 8:
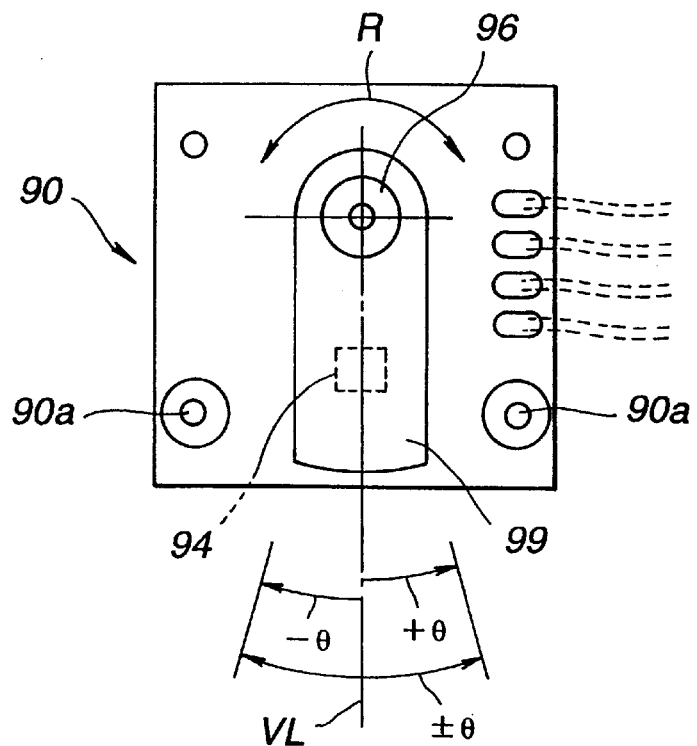
FIG. 8 is a plan view showing inclination sensor applied to the motor-operated bicycle according to this invention.
Figure 9:
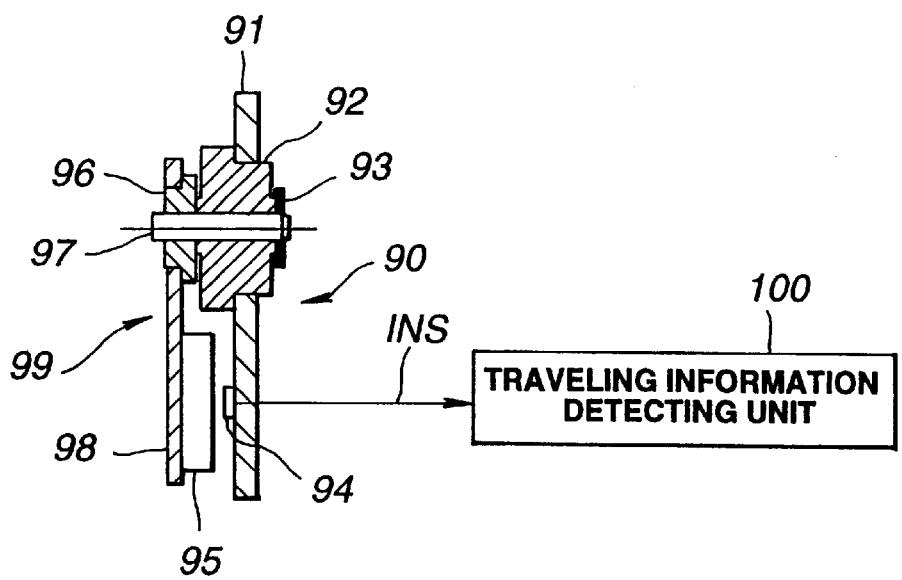
FIG. 9 is a cross sectional view of the inclination sensor.

The inclination sensor 90 as inclination information detecting means of FIG. 2 will now be described. The inclination sensor 90 is disposed at the attachment plate 21 of FIG. 1, and has a configuration as shown in FIGS. 8 and 9. The inclination sensor 90 is adapted so that a pendulum 99 is rotatably supported through a bearing 92 with respect to a base (substrate) 91 of steel. The bearing 92 is a bearing of sintered metal or resin and a Hall element 94 for detection of magnetic field is attached on the base 91 of steel. The pendulum 99 includes a yoke 98, a boss 96 and a shaft 97. The shaft 97 is fitted into the boss 96 and the boss 96 holds a yoke 98. The shaft 97 is attached with respect to the bearing 92 by means of an E ring 93. The yoke 98 is provided with a magnet 95 and this yoke 98 is made up by magnetic permeability material.

Figure 10:
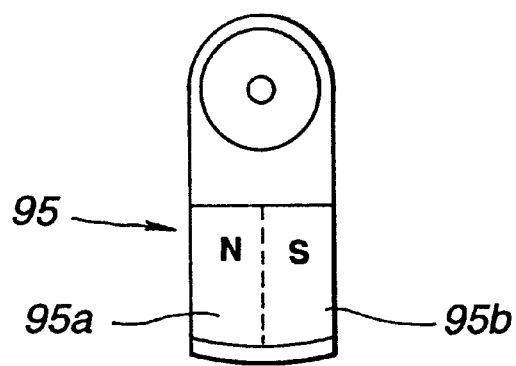
FIG. 10 is a front view showing a pendulum constituting the inclination sensor.
Figure 11:
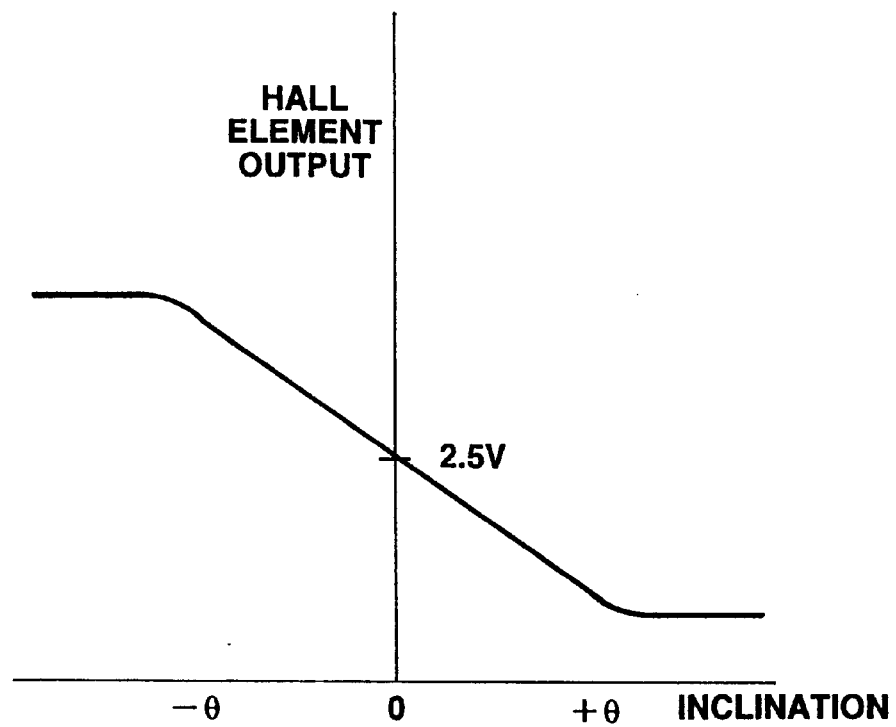
FIG. 11 is a characteristic diagram showing the characteristic of the inclination sensor.

The magnet 95 has an N pole 95a and a S pole 95b as shown in FIG. 10. The Hall element 94 of FIG. 9 detects change of magnetic field of the N pole 95a and the S pole 95b of the magnet 95 as the result of the fact that the pendulum 99 moves in the direction indicated by arrow R in FIG. 8.

The angle that the pendulum 99 is inclined in the direction indicated by arrow R in FIG. 8 is indicated in terms of plus and minus θ in FIG. 8. The inclination angle θ of the pendulum 99 is an inclination angle with respect to line VL in the direction perpendicular to the line which connects the front wheel 16 and the rear wheel 17 of the motor-operated bicycle 1000 of FIG. 1. For example, in the case of the rising hill, the pendulum 99 is inclined in the θ direction. In the case of the down hill, the pendulum 99 is inclined in the θ direction. Namely, an output of the Hall element 94 is set so that it linearly decreases with respect to the inclination of the θ direction and linearly increases with respect to the inclination of θ direction. An output of the Hall element 94 is sent to the traveling information detecting unit 100 side as an inclination signal. INS.

Figure 12:
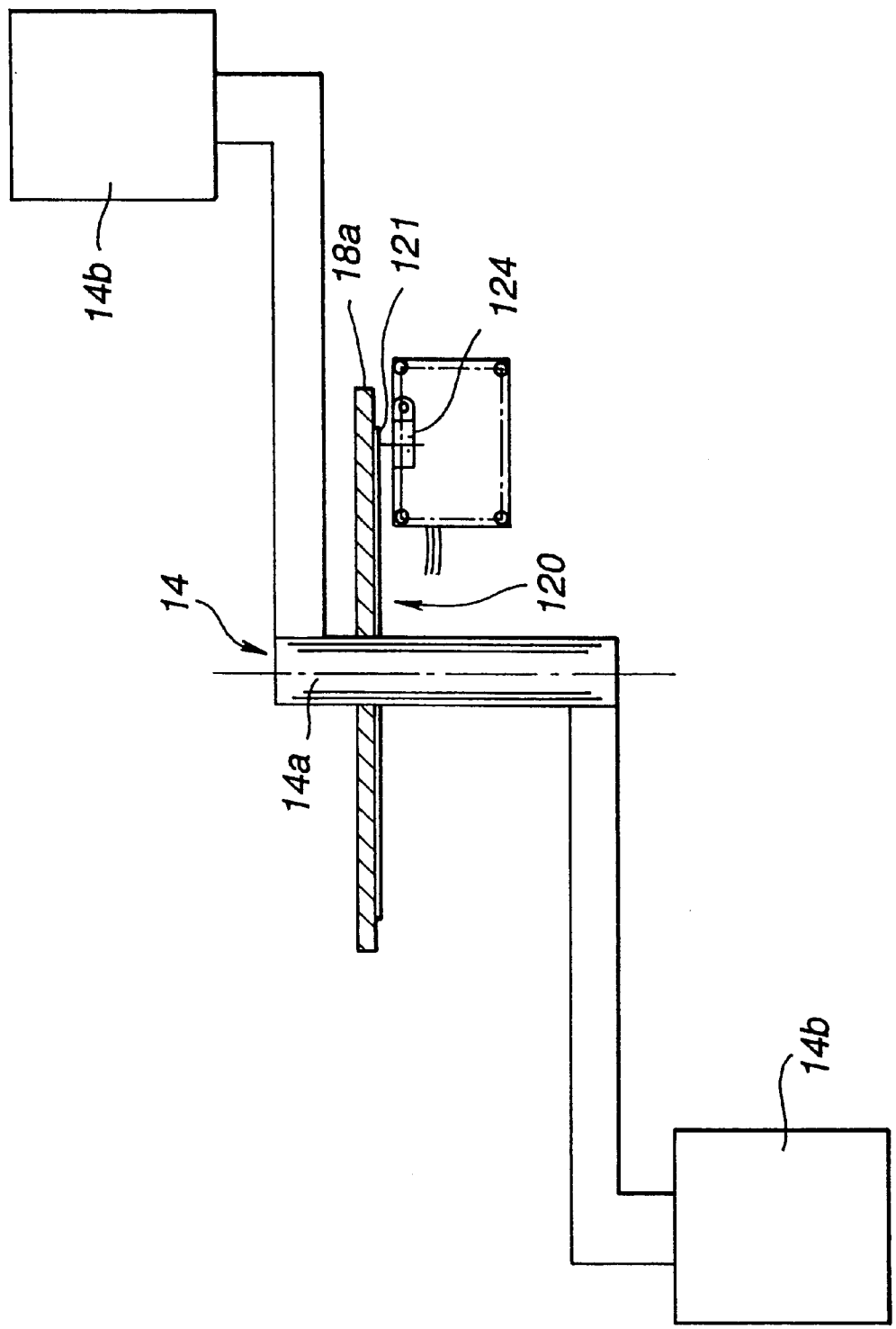
FIG. 12 is a view showing crank and crank rotation sensor constituting the motor-operated bicycle shown in FIG. 1.

The crank rotation sensor 120 shown in FIGS. 1 and 2 will now be described with reference to FIGS. 12, 13 and 14.

The crank rotation sensor 120 is disposed in correspondence with a crank shaft 14a of the bicycle of FIG. 1. As shown in FIG. 12, the crank shaft 14a includes two pedals 14b, 14b. The crank shaft 14a is adapted so that a reflection plate 121 is fixed with respect to the first gear 18a. At this reflection plate 121, as shown in FIG. 13, mirror portions 122 and non-reflection portions 123 are alternately disposed in the circumferential direction. This reflection plate 121 is a circular plate shaped reflection plate. In this case, 23 mirror portions 122 and 23 non-reflection portions 123 of the reflection plate 121 are provided. A light receiving/emitting section 124 is provided in a manner to correspond to the reflection plate 121.

Figure 14:
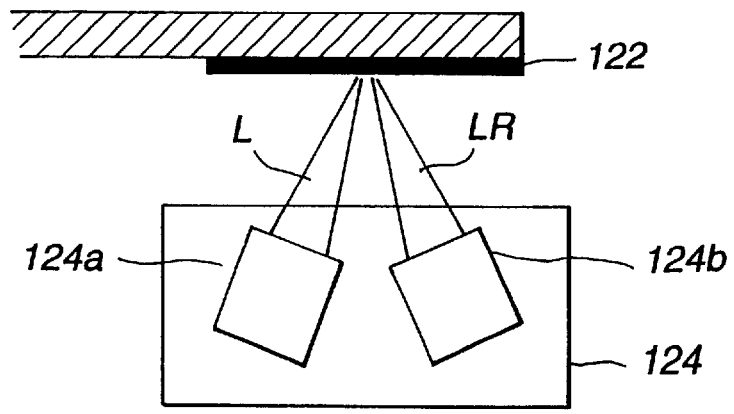
FIG. 14 is a view for explaining the operation of the crank rotation sensor.

This light receiving/emitting section 124 comprises a light emitting portion 124a and a light receiving portion 124b as shown in FIG. 14, for example, wherein the light emitting portion 124a is, e.g., light emitting diode and the light receiving portion 124b is a photo-transistor. Light L that the light emitting portion 124a emits is reflected at the mirror portion 122, resulting in return light LR. The return light LR thus obtained can be received by the light receiving portion 124b. Namely, in the case where the mirror portion 122 is faced to the light receiving portion 124b, light L can be transmitted to the light receiving portion 124b as return light LR. Thus, the crank rotation sensor 120 can output a crank rotation signal CRS corresponding to the number of rotations of the reflection plate 12 caused to be integral with the crank shaft 14a to the traveling information detecting unit 100.

It is to be noted that when light receiving/emitting section 124 of long detection distance shown in FIG. 14 is used, even in the case where the reflection plate 121 is warped, influence of change in distance can be avoided. In addition, because there are many light rays serving as disturbance, it is desirable to allow output from the electric circuit portion of the traveling information detecting unit 100 which receives the crank rotation signal CRS from the light receiving/emitting section 124 to have relatively great hysteresis as, occasion demands.

With respect to the inclination signal INS sent from the inclination sensor 90 shown in FIG. 9 to the traveling information detecting unit 100 side, inclination of the pendulum 99 is utilized in order to detect inclination on the traveling road surface of the motor-operated bicycle 1000. In this case, its inclination signal INS is analog value. Accordingly, it is necessary to carry out analog-to-digital conversion at the A/D converter 104 as shown in FIG. 2.

Figure 13:
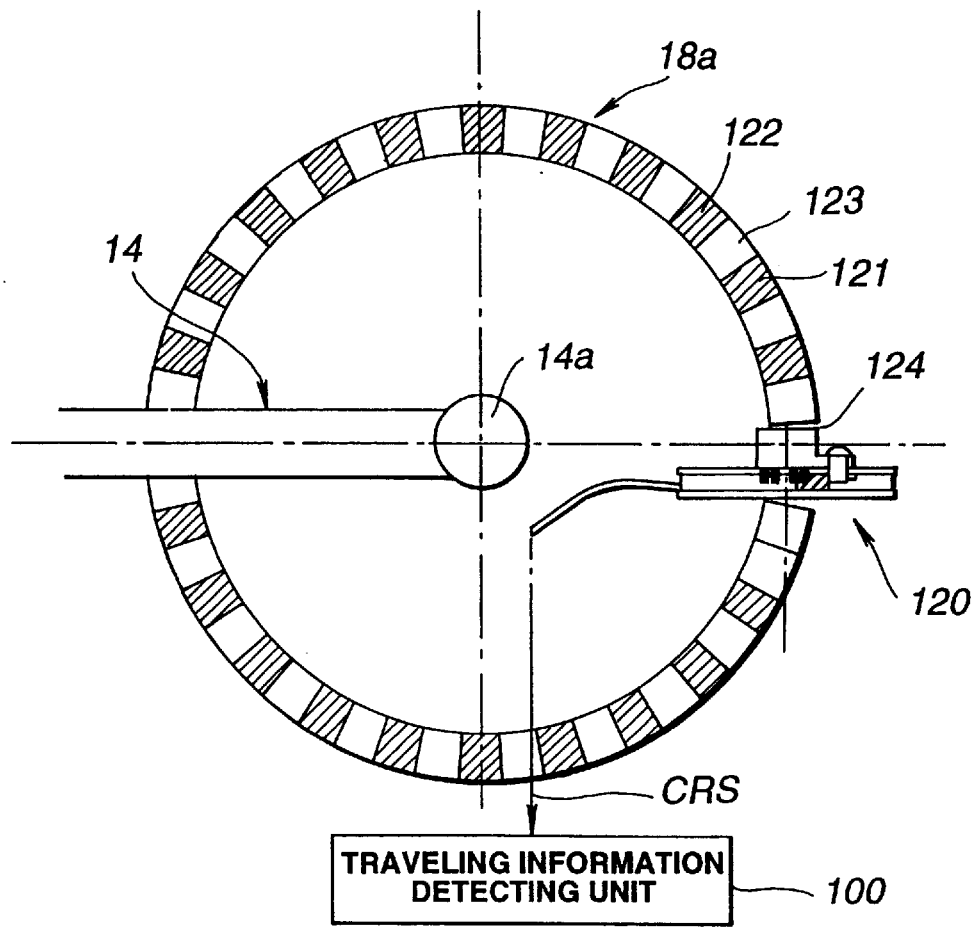
FIG. 13 is a side view showing the crank and crank rotation sensor.

Moreover, the reflection plate 121 shown in FIG. 13 can be provided in a manner stuck to the first gear 18a for the crank. The crank rotation signal CRS obtained from the light receiving portion 124b of the light receiving/emitting section 124 is counted by the counter 103 shown in FIG. 2 to measure the number of crank rotations. In a more practical sense, since 24 mirror portions 122 shown in FIG. 13 are provided with respect to one circumference, the light receiving portion 124b of FIG. 14 outputs 24 crank rotation signals (pulses) CRS followed by one rotation of the first gear 18a for crank. In the case where the motor 31 of the driving force assist mechanism 30 of FIG. 1 rotates in synchronism with the crank 14, the gear ratio between the first gear 18a for crank and the second gear 18b of the rear wheel 17 of FIG. 1 is, e.g., 44:16. Accordingly, the motor 31 rotates at a speed 2.75 times greater than the crank 14. It is to be noted that in the case where driver ordinarily steps on the pedals so that the motor 31 and the crank 14 are synchronous with each other and in the case where rotation of the crank 14 is above rotation of the motor as described later, the motor 31 is driven to assist the driving force.

Further, since the motor 31 is constituted as the so-called direct motor which directly rotates the rear wheel, the rear wheel 17 is directly driven by the motor by synchronization between the motor 31 and the crank 14, etc. However, in the case where driving force (power) is transmitted to the crank, or driving force is transmitted to the front wheel, it is sufficient to carry out drive operation of the motor by synchronization between the rear wheel and the crank, etc.

The structure of the motor 31, the speed sensor 110, the current sensor 150 and the temperature sensor 160 shown in FIG. 2 will now be described in order.

Figure 15:
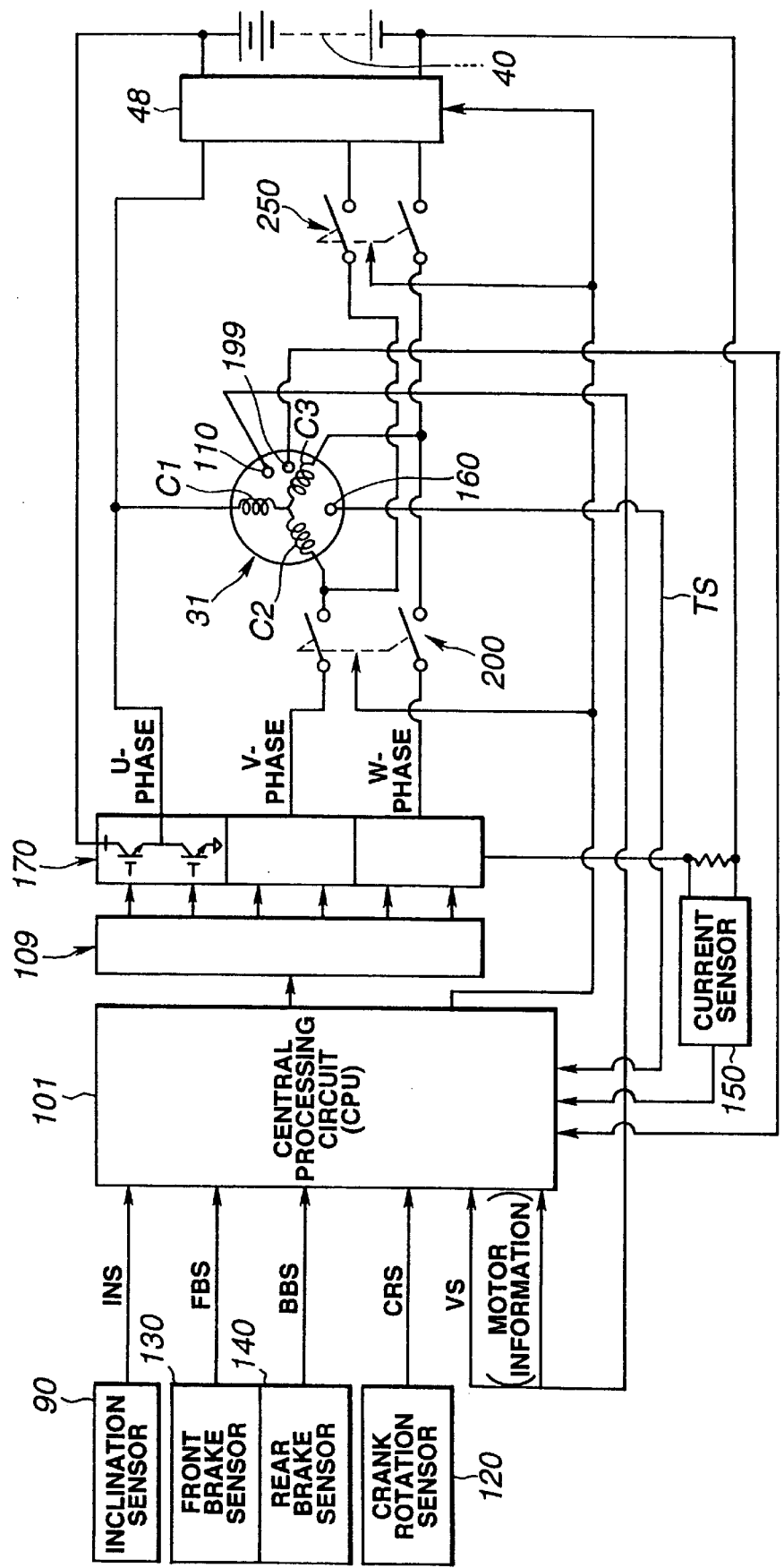
FIG. 15 is a block diagram of the control system of the motor constituting the driving force assist mechanism.

FIG. 15 shows, in more detail, the portions in the vicinity of the motor 31 and the various sensors shown in FIG. 2.

The central processing circuit 101 receives inclination signal INS from the inclination sensor 90, receives front brake signal FBS from the front brake sensor 130, receives rear brake signal RBS from the rear brake sensor 140, and receives crank rotation signal CRS from the crank rotation sensor 120, and has ability to obtain speed signal VS from the speed sensor 110 of the motor 31. In addition to this speed sensor 110, the motor 31 includes the temperature sensor 160 and a rotor position sensor 199. Further, a current sensor 150 is provided between the motor 31 and the central processing circuit 101.

Figure 16:
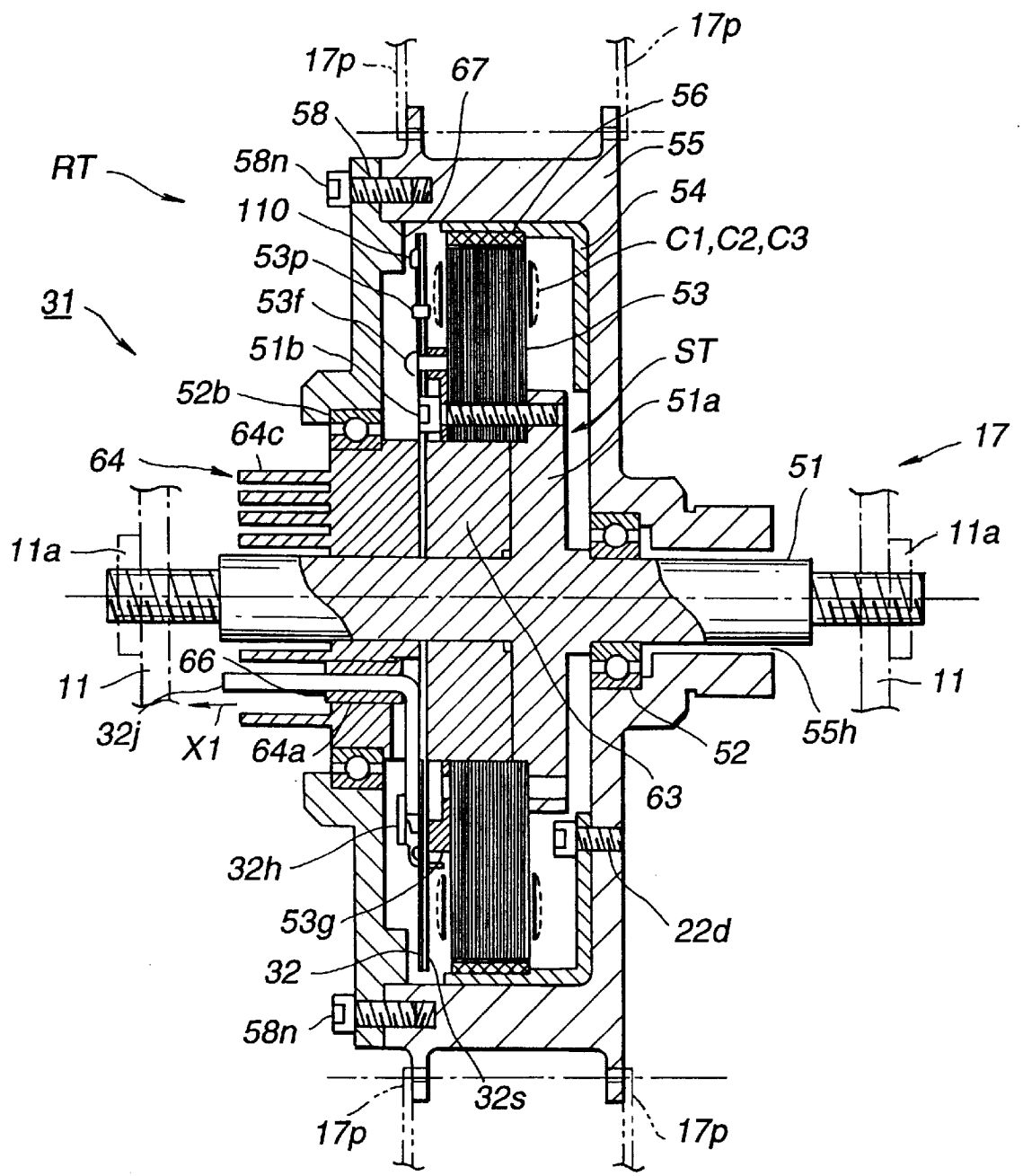
FIG. 16 is a cross sectional view showing an example of a motor of the outer rotator type provided at rear wheel.
Figure 17:
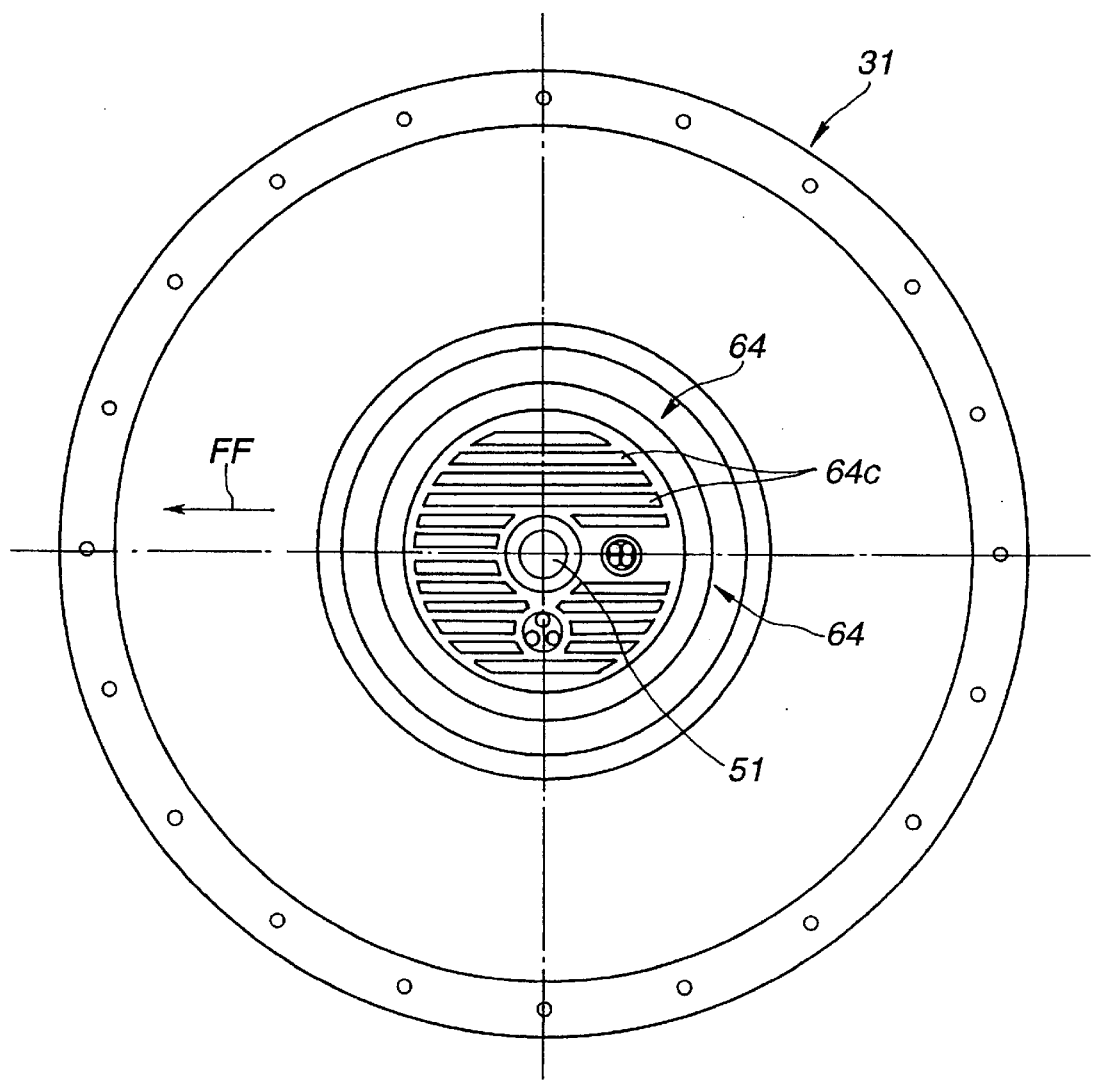
FIG. 17 is a side view of the motor shown in FIG. 16.
Figure 18:
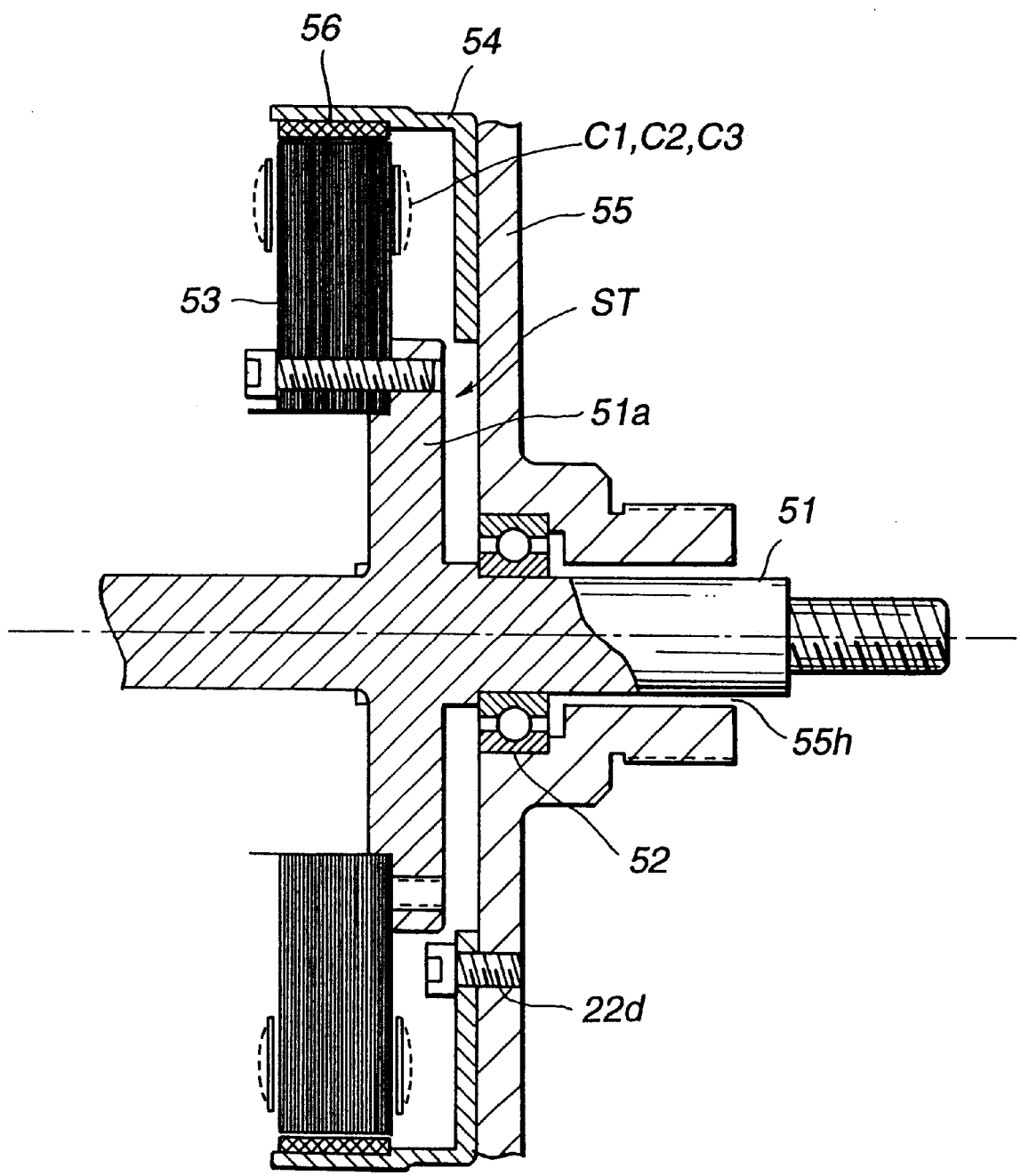
FIG. 18 is a cross sectional view showing a portion of the rotor and stator of the motor.

The structure of the motor 31 is shown in FIGS. 16 and 17. This motor is an outer rotor type three-phase brushless motor adapted so that the outside rotor RT rotates and the inside stator ST is stationary (fixed). This motor 31 is provided in correspondence with a shaft 51 of the rear wheel 17 as shown in FIG. 1. Accordingly, the motor-operated bicycle 1000 is a rear wheel driven type bicycle. The shaft 51 is fixed by screws 11a with respect to the frame 11 of FIG. 1.

Figure 19:
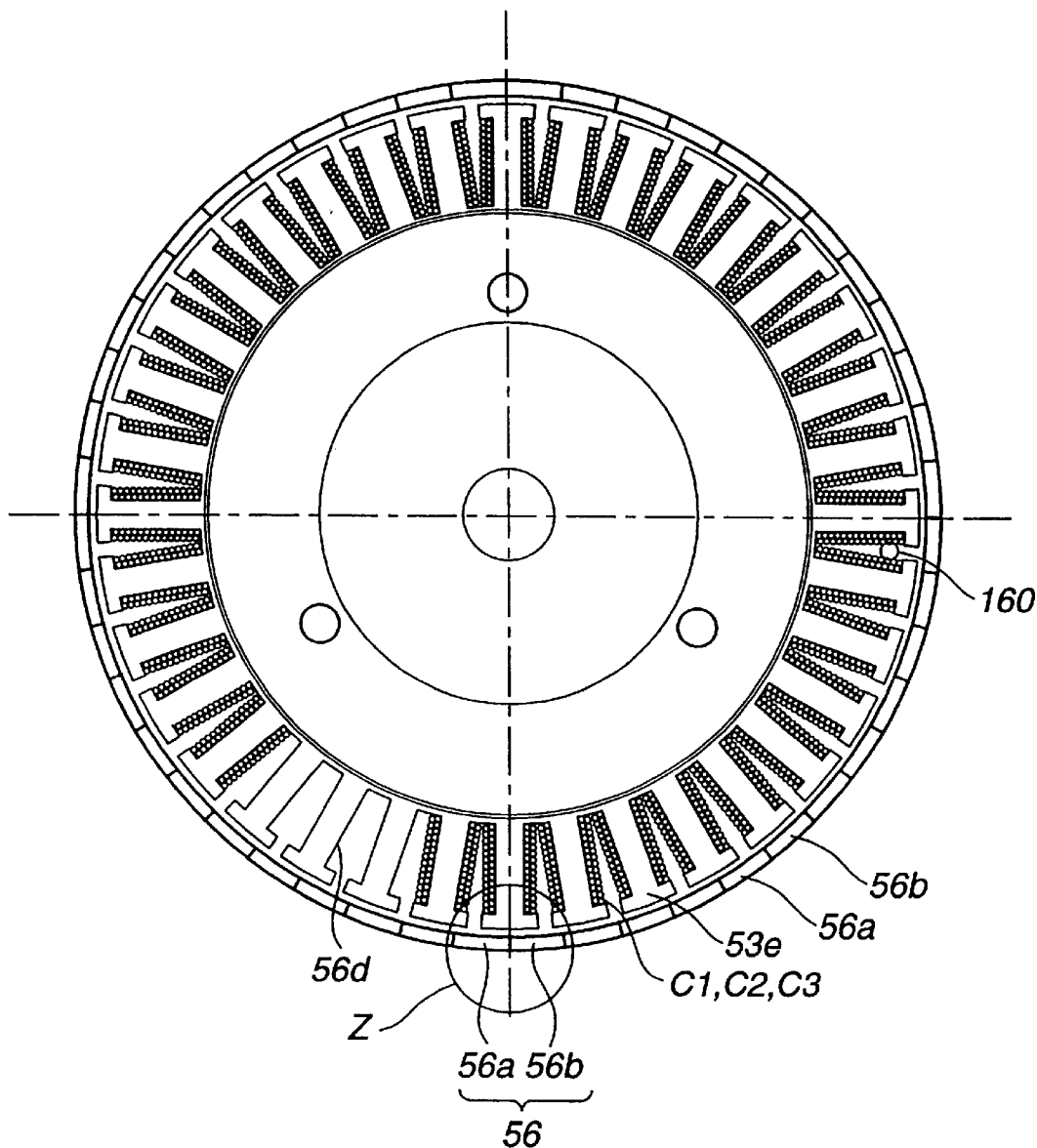
FIG. 19 is a side view showing the stator of the motor.

Initially, the stator ST of the motor 31 will now be described. The stator ST of the motor 31 includes an iron core 53 integral with respect to the shaft 51 and a stator holder 63, and a radiator 64 and a motor board 32, etc. in addition to the above. The iron core 53 is fixed by using screw 51b at a flange 51a of the shaft 51 of the stator ST side. Coils C1, C2, C3 are wound on the iron core 53. These coils C1, C2, C3 are wound in a predetermined pattern at ion core toothed portions 53e as shown in FIG. 19. Coils 53d for detection of counter electromotive power (voltage) are provided at the intermediate iron core toothed portions 53e. These coils C1, C2, C3 are disposed in a manner opposite to rotor magnet 56 of the rotor RT which will be described later in the circumferential direction (rotational direction of the rotor RT).

Figure 20:
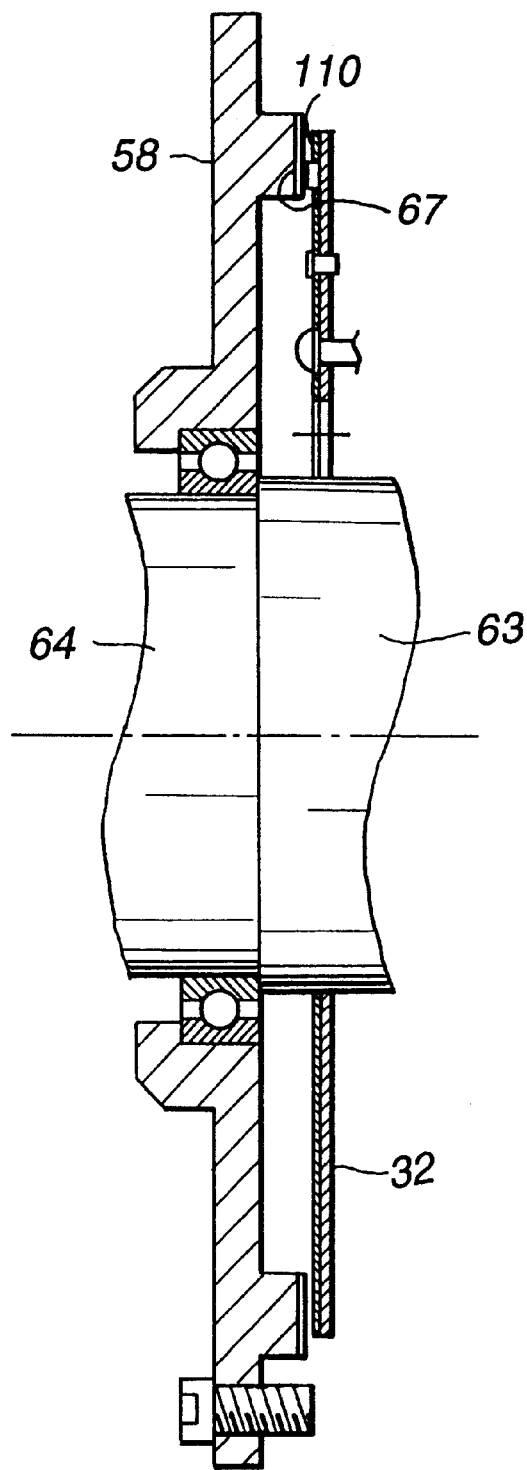
FIG. 20 is a cross sectional view showing a portion of a motor board provided at the motor.

As shown in FIGS. 20 and 16, the motor board 32 is disposed in such a manner facing to the reflection plate 67 of a housing cap 58 of the rotor RT. The speed sensors 110 are provided on the motor board 32 shown in FIG. 21. These speed sensors 110 are also referred to as photo-reflector. Three speed sensors are provided at predetermined intervals along the circumferential direction of the circular motor board 32. As shown in FIG. 16, the motor board 32 is fixed by using a board holder 53g by means of screw 53f with respect to the iron core 53.

Figure 21:
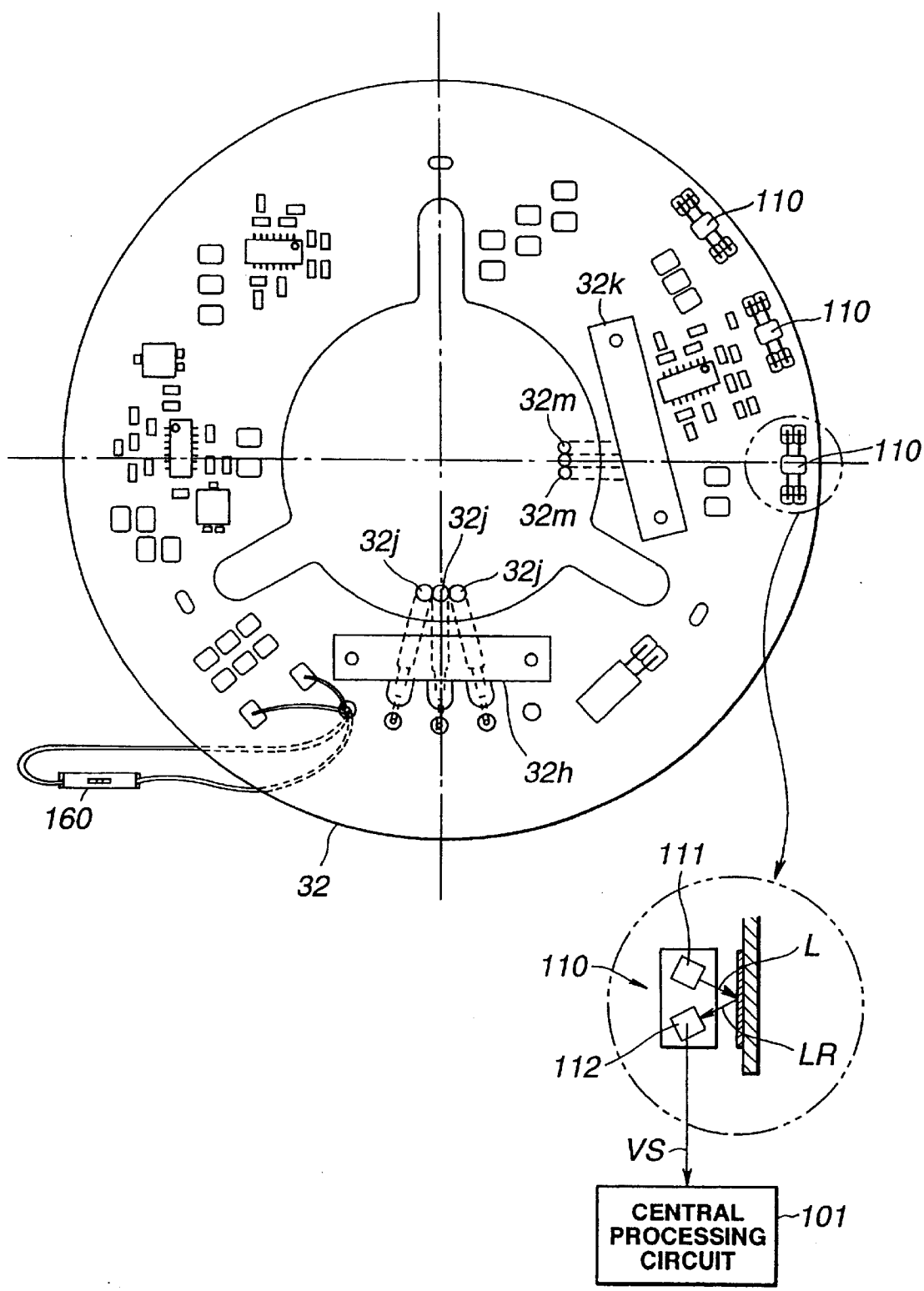
FIG. 21 is a front view of the motor board.

An electric power supply holding plate 32h of the motor board 32 shown in FIG. 21 holds electric power supply lines 32j. These power supply lines 32j are electric power supply lines for supplying electric power from the power stage 170 to the three coils C1, C2, C3 shown in FIG. 15. A signal line holding plate 32k of the motor board 32 holds three signal lines 32m. These signal lines 32m are signal lines which connect the speed sensors 110 and the central processing circuit 101 of FIG. 15. The temperature sensor 160 is provided on the motor board 32 as shown in FIG. 21. This temperature sensor 160 is a sensor comprised of a diode inserted into the coils of the motor 31, and serves to compare the voltage of the temperature sensor 160 with a set value, whereby when the voltage is above the set value as the result of the fact that the temperature rises, the temperature sensor 160 outputs a temperature detection signal to the central processing circuit 101 of FIG. 15. The central processing circuit 101 receives this signal to judge that abnormal state has taken place in the motor 31 to stop energization with respect to the motor 31 to stop drive operation. In this example, in the case where temperature that the temperature sensor 160 detects is lower than a predetermined value after the drive operation is stopped, a signal of another system using hysteresis is outputted. Accordingly, in response thereto, drive of the motor 31 is re-started. The temperature detection signal of the temperature sensor 160 is caused to undergo analog/digital conversion at the A/D converter 104 as shown in FIG. 2, and is taken in as temperature signal TS (see FIG. 15).

Figure 22:
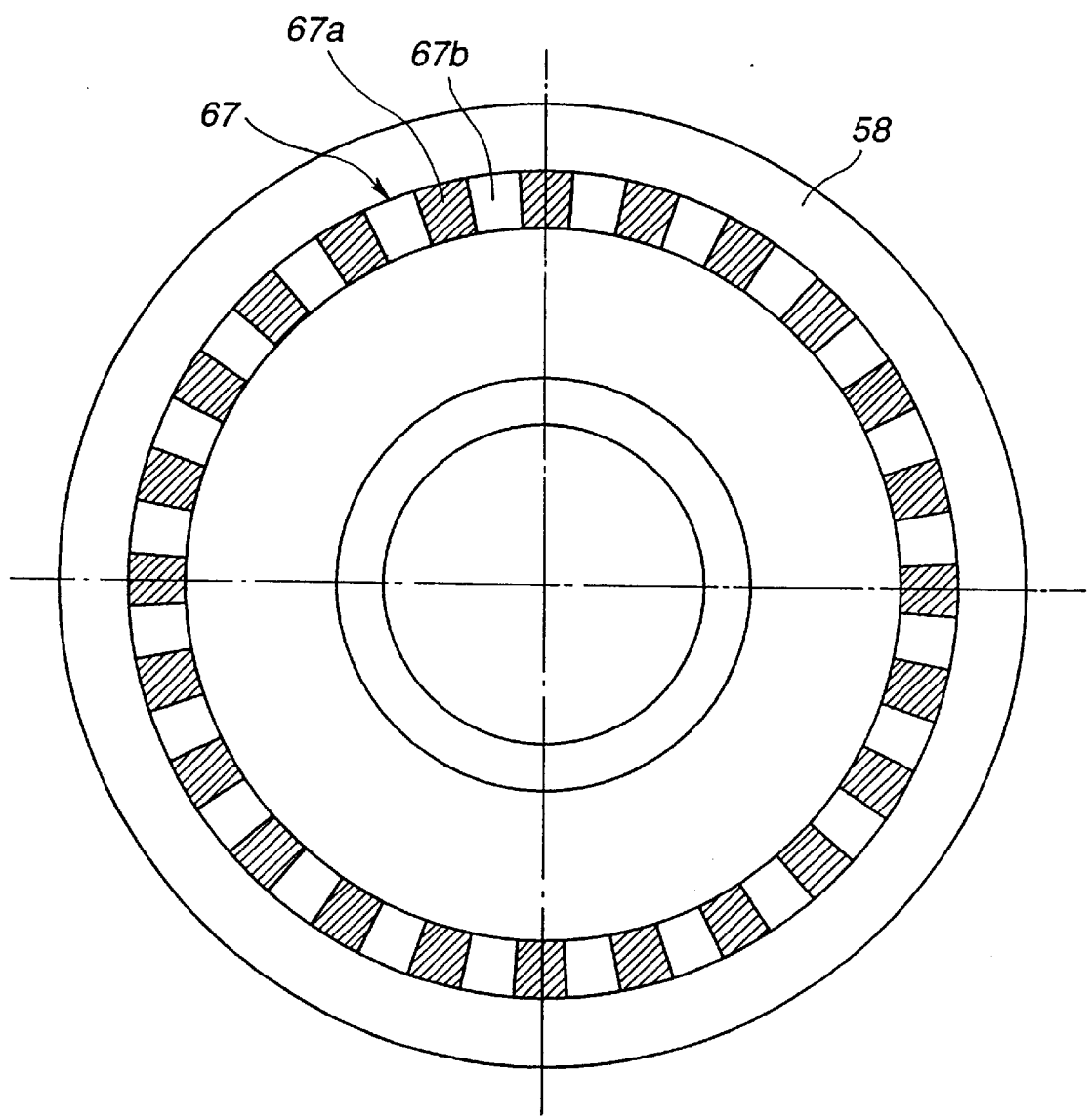
FIG. 22 is a front view showing reflection plate disposed in a manner opposite to the motor board.

The three speed sensors 110 shown in FIG. 21 are faced to the reflection plate 67 attached at the housing cap 58 of the rotor RT shown in FIG. 16. This reflection plate 67 is adapted so that 24 mirror portions 67a and non-reflection portions 67b are provided one after another as shown in FIG. 22, and these portions are formed along the circumferential direction. Each speed sensor 110 comprises a light emitting portion 111 and a light receiving portion 112. Light L of the light emitting portion is reflected on the mirror portion 67a of the reflection plate 67, resulting in return light LR. The return light thus obtained can be received by the light receiving portion 112. Accordingly, the speed sensors 110 optically detect, in a non-contact manner, the presence or absence of only the mirror portions 67a of the reflection plate 67 of FIG. 22, thereby making it possible to send speed signal VS followed by rotation of the rotor RT of the motor 31 shown in FIG. 16 to the central processing circuit 101 as shown in FIG. 15.

Figure 23:
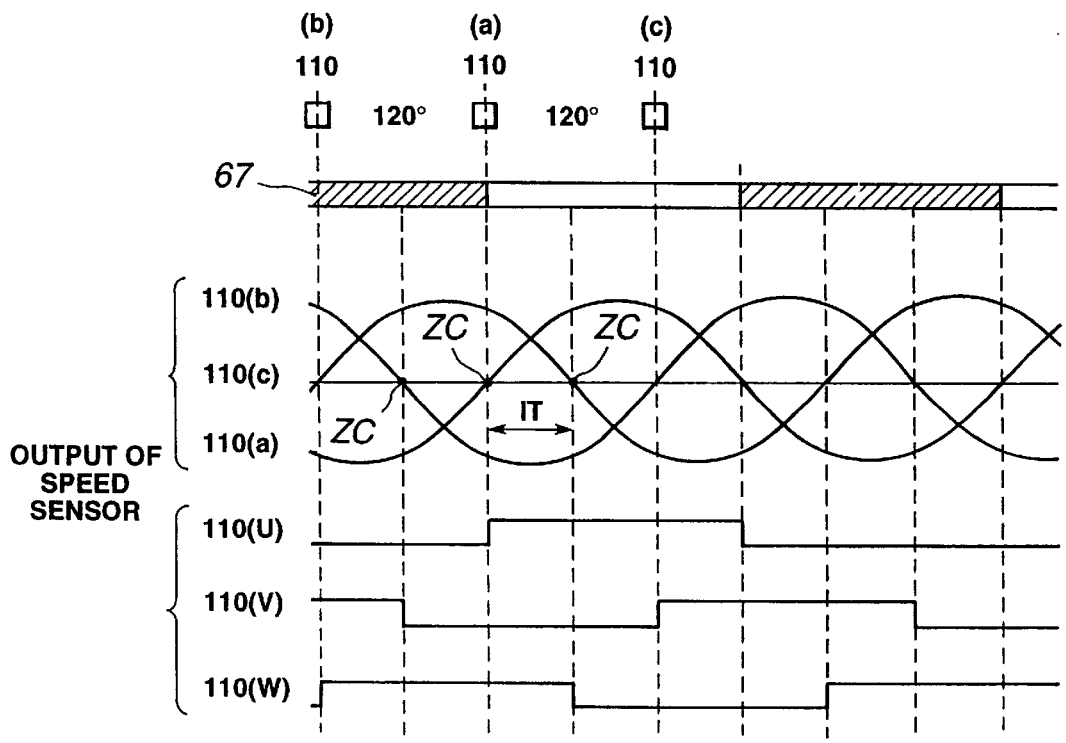
FIG. 23 is a view showing output characteristic of a speed sensor of the motor.

As shown in FIG. 23, the three speed sensors 110, 110, 110 measure time interval of detection of zero cross points ZC by the counter shown in FIG. 2. In a more practical sense, since there are 24 cycle×6 zero cross points with respect to one rotation of the rotor RT of the motor 31, such zero cross points are counted by the system clock. It is to be noted that because there are instances where variations are included between these three speed sensors 110, movement average value of six detecting operations is calculated at the inside to thereby cancel variations between three sensors 110. A PWM signal preparation logic section 109 shown in FIG. 2 obtains speed sensor outputs (U), (V), (W) of rectangular wave on the basis of outputs 110(a), (b), (c) of the speed sensors shown in FIG. 23.

Figure 24:
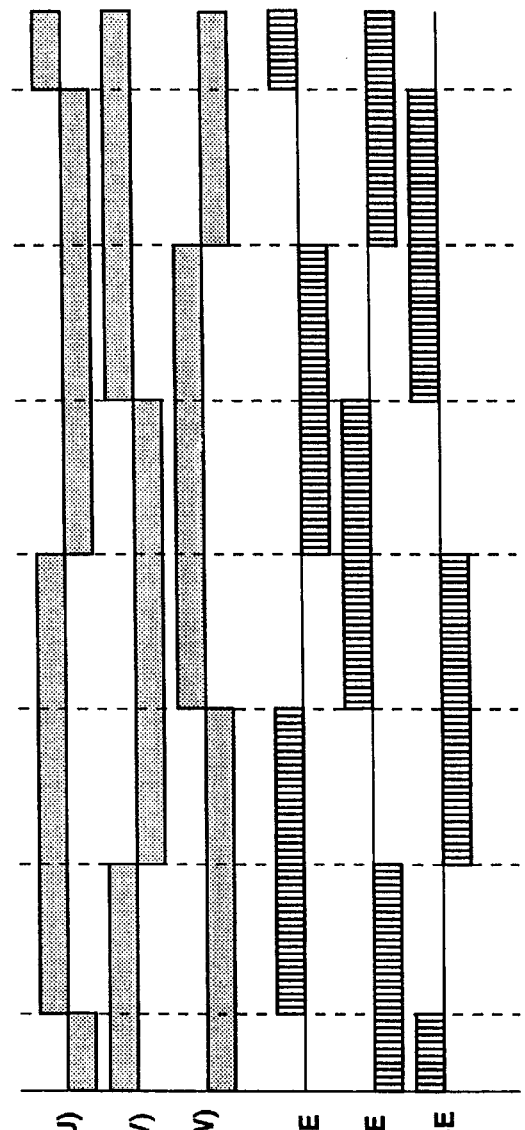
FIG. 24 is a view showing one example of the output characteristic of the speed sensor of the motor and switching timing of the motor.

FIG. 24 shows an example of switching timings of U-phase, V-phase and W-phase corresponding to the coils C1, C2, C3 that the PWM signal preparation logic section 109 shown in FIG. 2 forms in correspondence with the speed sensor outputs 110 (U), (V), (W).

Figure 25:
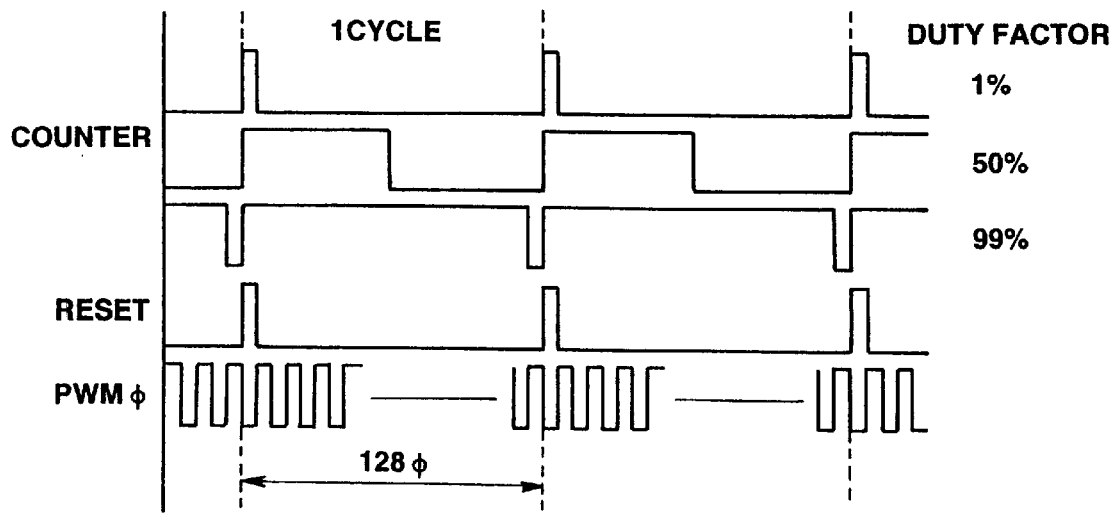
FIG. 25 is a view showing an example of PWM signal waveform when the motor is PWM-driven.
Figure 26:
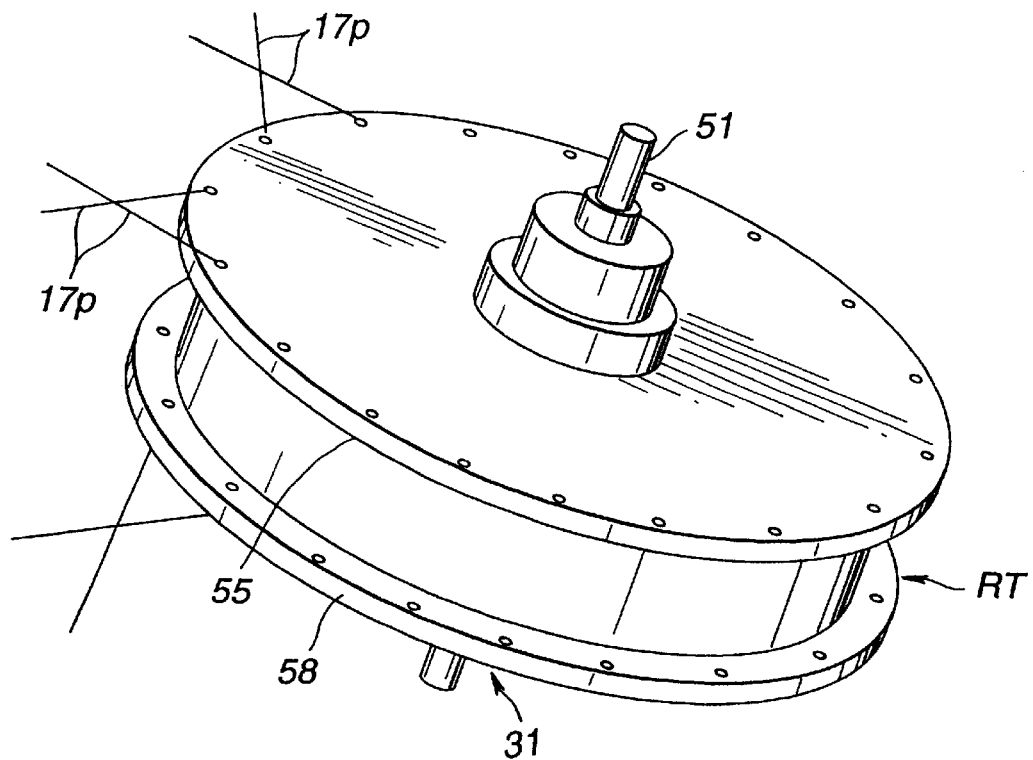
FIG. 26 is a perspective view of the appearance of the motor.

FIG. 25 shows an example of waveform of PWM signal with respect to the driver of FIG. 15 that the PWM signal preparation logic section 109 forms. Counter units 105a to 105c of the PWM data section 105 shown in FIG. 2 correspond to respective phases of the U-phase, the V-phase and the W-phase, and can respectively carry out count operations by duty factors as shown in FIG. 25.

Further, the current sensor 150 shown in FIG. 15 and FIG. 2 takes voltage produced across the both ends of the sense resistor (e.g., 0.5 ohms) of the GND side into the A/D converter 104 shown in FIG. 2 to carry out analog/digital conversion to thereby convert it into current. The reason why the current sensor is required as stated above is as follows.

(1) By limiting the rush current, the expanded current rating of the battery or the rotation circuit element can be kept to small value. Particularly, when a lithium ion battery is used as the secondary battery, employment of the current sensor is effective for improvement of the reliability of this battery. In addition, since such limitation of the rush current is a momentary limitation, there is no effect (influence) on lowering of assist driving force given by the drive operation of the motor 31.

(2) normal state of the motor can be detected.

In the motor board 32 shown in FIG. 16, the electric power supply lines 32j are connected to the motor board 32 through the power supply holding plate 32h from the outside by using a sealing tube 66 provided at the radiator 64. This sealing tube 66 serves to seal the portion between the inside and the outside of the motor 31. When any coil power supply line 32j is pulled out toward the outside, the sealing tube 66 is tightened at a hole 64a of the radiator 64, and is no longer extruded (pulled out) to the outside. Namely, since the sealing tube 66 is adapted so that the diameter of the inside portion is greater than that of the outside portion. Even if any coil power supply line 32j is pulled out in the outside direction which is the direction indicated by arrow X1 in FIG. 16, the sealing tube 66 is no longer extruded (pulled out) to the outside. These coil power supply lines 32j are fixed by the electric power supply line holding plate 32h so that they do not come into contact with the housing cap 58.

The stator holder 63 shown in FIG. 16 is comprised of, e.g., aluminum, and the radiator 64 is also comprised of aluminum. The radiator 64 includes fins 64c for radiation. As shown in FIG. 17, plural fins 64c are formed in the traveling direction which is the direction indicated by arrow FF in FIG. 17 of the motor-operated bicycle 1000. By making up (manufacturing) the stator holder 63 and the radiator 64 by material of good radiation, it is possible to easily radiate, toward the outside, heat produced in the vicinity of the coils (C1, C2, C3) and the iron core 53 of the stator ST to exclude it.

The rotor RT of the motor 31 will now be described.

The housing cap 58 is fixed with respect to the housing 55 by using the screw 58n as shown in FIG. 16. The housing 55 and the housing cap 58 constitute an accommodating member for accommodating the stator ST. The housing gap 58 and the housing 55 accommodate the previously described stator ST. The housing 55 includes a hole 55h, and the shaft 51 is passed (penetrated) to the coils C1, C2, C3 along the circumferential direction with a predetermined spacing.

Figure 27:
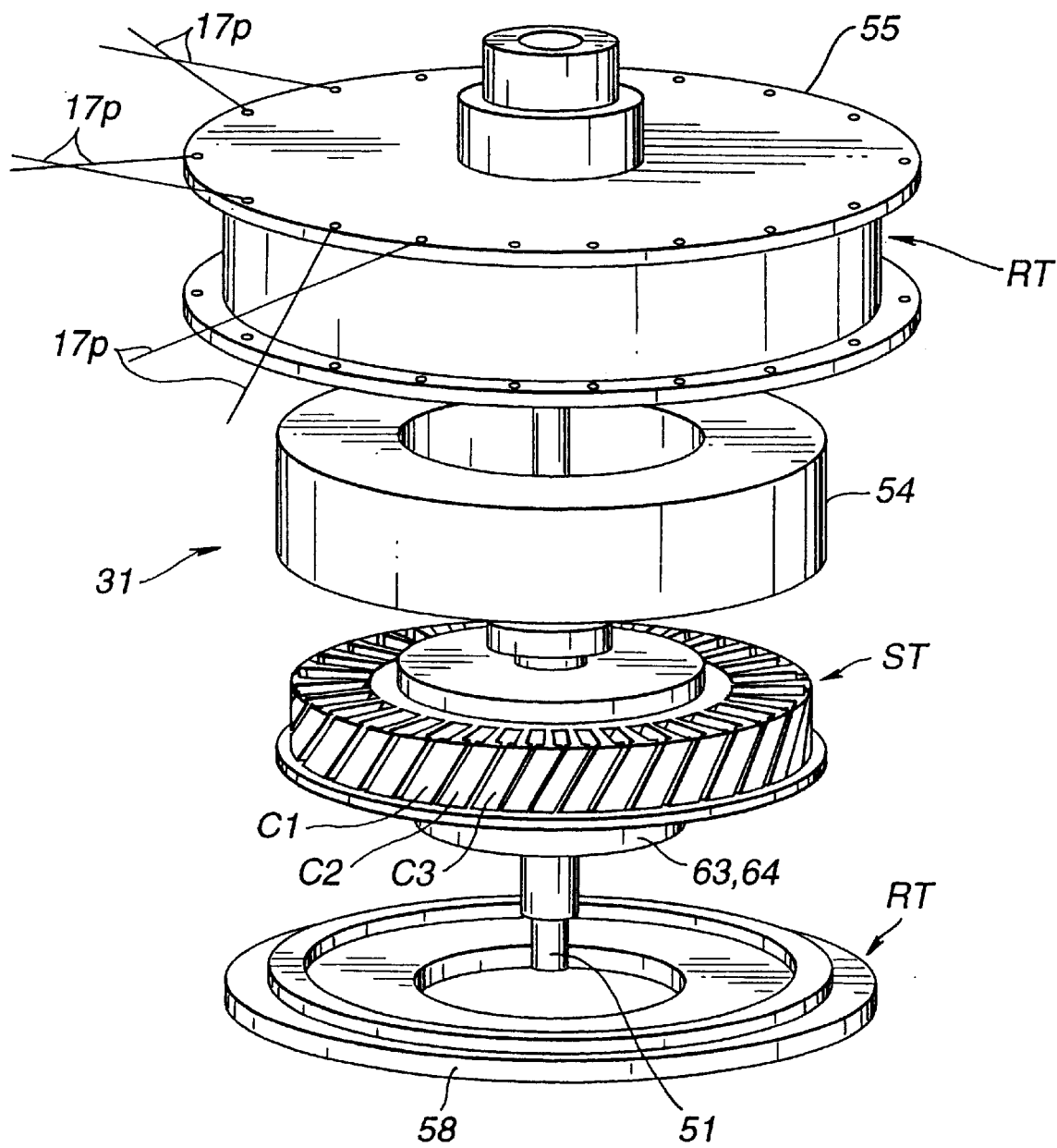
FIG. 27 is an exploded perspective view of the motor.
Figure 28:
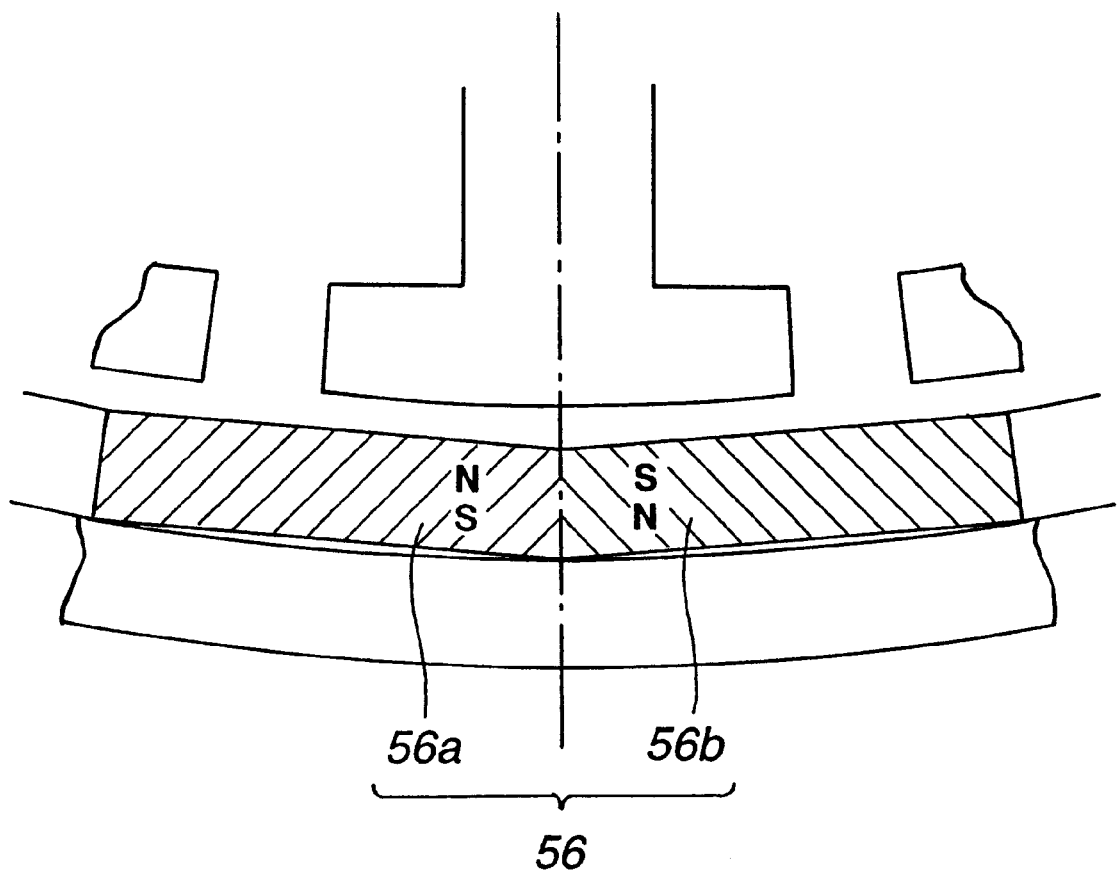
FIG. 28 is a view showing rotor portion (Z) of the motor shown in FIG. 19.

Skew angle is set at the iron core 53 as shown in FIGS. 27 and 19. The reason why the iron core 53 has skew angle and is obliquely set as stated above is to prevent torque variations (change).

It is to be noted that counter electromotive power (voltage) detection coil 53d may be wound by one slot with respect to each of phases (U, V, W phases) as shown in FIG. 19 to use this counter electromotive power (voltage) detection coil 53d as a sensor for taking energization timing of the coil in place of the light receiving/emitting section 110. In this case, such a way of use has a function equivalent to the sensorless drive, and has the merit that the problem of starting does not exist for such a use. Namely, the reason thereof is as follows. In the state where the motor-operated bicycle is completely stopped, output for taking energization timing is not produced in the counter electromotive power (voltage) detection coil 53d. However, since the driver moves the bicycle or steps on the pedal in the case where he starts drive operation, output is produced in the detection coil 53d and energization timing of the motor is thus obtained, so there is no stray in the rotation direction at the time of starting which is peculiar to the sensorless drive.

In order to assemble the motor 31, as shown in FIG. 16, the stator holder 63 consisting of aluminum having good thermal conductivity is forced into the shaft 51. The iron core 53 and the board holder 53g are commonly fastened by means of screw 51b with respect to the flange 51a of the shaft 51. At this time, the iron core 53 and the stator holder 63 are fitted so that they are integrally coupled (combined).

The motor shield plate 32s is fixed by means of screw 53f with respect to the board holder 53g. The motor board 32 is fixed by means of screw 53p with respect to the motor shield plate 32s while adjusting angle. The angle is set so that signal by the reflection plate 67 of the light receiving/ emitting section 110 serving as the photo-reflector takes energization timing of the coils (C1, C2, C3). The number of poles of the magnet 56 and the number of mirror portions which is the number of teeth of the reflection plate 67 are caused to be equal to each other. The radiator 64 is inserted into the shaft 51 to allow it to be closely in contact with the motor shield plate 32s so that radiation heat from the coils (C1, C2, C3) is difficult to be transmitted to the motor board 32. Thus, the motor board 32 can be protected from heat.

Moreover, heat of the coils C1, C2, C3 and/or the iron core 53 may be dissipated through the stator holder 63. In this case, there may be employed a method in which because heat resistance of the coil is about 200° C., whereas heat resistance of the semiconductor device on the motor board 32 is about 80° C., a spacer is inserted between the stator holder 63 and the motor shield plate 32s in order that temperature gradient takes place.

The rotor RT is rotatably supported through the bearings 52, 52b with respect to the stator ST, and is held by the housing 55 and the housing cap 58 therebetween from the both sides and is fixed by means of screw 58n with respect to the housing 55 and the housing cap 58. In this case, packings may be respectively placed between the housing 55 and the housing cap 58 and the rotor RT.

The motor 31 used here is the brushless motor of the outer rotor type which is called a wheel in motor. Employment of the motor 31 provides the following merits.

(1) As shown in FIG. 16, the housing 55 and the housing cap 58 of the rotor RT are rotatably supported with respect to the shaft 51 and the radiator 64 of the stator ST side at both side positions of the rotor RT by using only two bearings 52, 52b. Accordingly, the width of the motor 31 can be reduced in respect of the axial direction of the shaft 51, and load of the rotor RT at the time of rotation can be received in well-balanced state in left and right directions.

(2) Since the housing 55 and the housing cap 58 of the rotor RT constituting the accommodating member of FIG. 16 which is also called a wheel are directly fixed by using the spokes 17b with respect to the rear wheel 17 of the motor-operated bicycle 1000 of FIG. 1, drive rotational force that the rotor RT produces can be directly applied to the rear wheel 17. In addition, since the stator is disposed within the rotor RT and the rotor RT is disposed within the rear wheel 17, appearance is permitted to become satisfactory as shown in FIG. 1.

(3) Since the iron core 53 of the stator ST is directly fixed on the shaft 51, the structure is simple.

(4) Since heat in the vicinity of the drive coil of the motor 31 can be dissipated to the outside through the radiator 64, the stator holder 63 and the shaft 51, and the housing 55 and the housing cap 58 can also diffuse (radiate) heat to the outside, cooling means is not particularly required for this motor 31.

(5) Since the stator ST provided with the coil portion of the motor 31 is accommodated in a form such that it is hermetically sealed within the housing 55 and the housing cap 58 of the rotor RT, water-proof and dust-proof of the inside of the stator ST and the rotor RT can be realized.

(6) Since the magnet 56 of the rotor RT is disposed at the inner surface of the outer circumferential portion side of the housing 55 so that torque produced can be obtained at the outermost circumferential side portion of the housing 55, if required torque produced can be obtained, the outer (outside) diameter of the rotor RT can be as small as possible and the thickness can be reduced. For this reason, the weight of the motor 31 accommodated within the wheel 17 of FIG. 1 can be lightened. In addition, a large torque can be obtained at a low speed.

Figure 29:
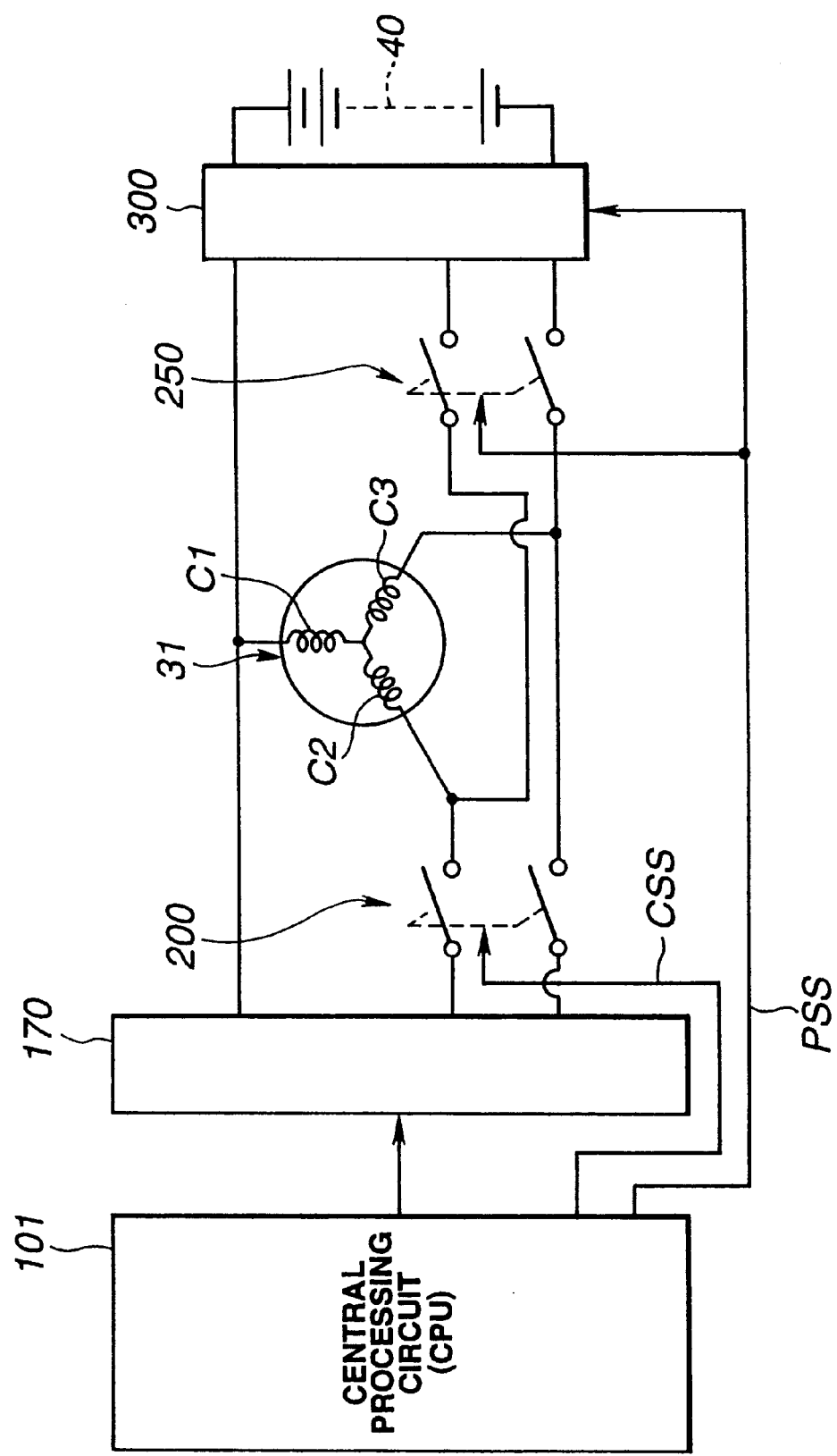
FIG. 29 is a circuit diagram showing motor and control section for controlling drive operation of the motor.

A function switching control section 3000 of the motor provided in association with the motor 31 will now be described with reference to FIGS. 29 and 30. This function switching control section 3000 includes a coil cut relay section 200 which is the first switching section, a relay section 250 for a charge circuit which is the second switching section, secondary battery 40 of the charging type, a charge circuit 300 for the battery, and the power stage 170, etc.

The coil cut relay section 200 is a relay section inserted (connected) between one ends of the coils C2, C3 and the motor driver power stage 170 to carry out ON/OFF operation of energization to the coils C2, C3. Moreover, the relay section 250 for a charge circuit is a relay inserted (connected) between the coils C2, C3 and the charge circuit 300 of the battery (secondary battery) 40 to carry out ON/OFF operation of power supply to the coils C2, C3.

The coil cut relay section 200 is operative so that when control signal CSS is given from the central processing circuit 101 in the case where there is a necessity to drive the motor 31 so as to deliver assist driving force to the drive wheel, it is turned ON so as to deliver power (current) from the power stage 170 to the coils C2, C3. In contrast, when no control signal CSS is given, the coil cut relay section 200 is turned OFF.

On the other hand, the charge circuit relay section 250 is turned ON by charge control signal PSS, and is turned OFF when no charge control signal PSS is given.

Figures 30, 31:
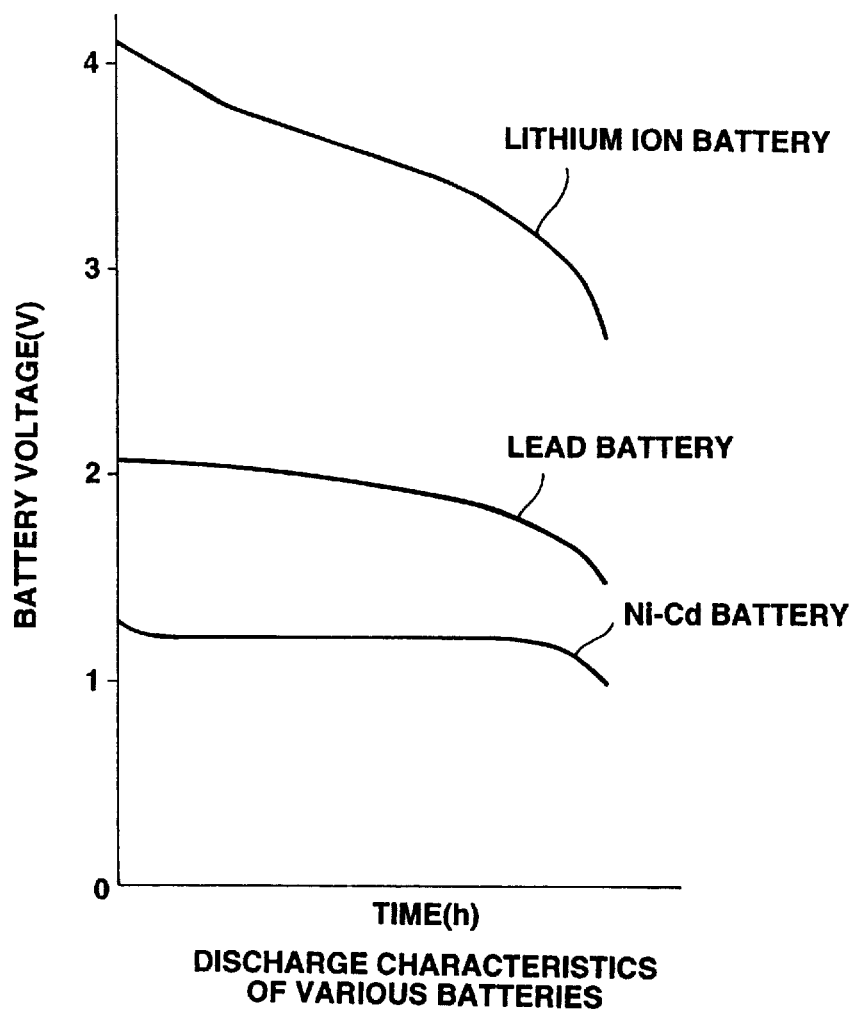
FIG. 30 is a view showing an example of the operation of a coil cut relay section and a relay section for a charge circuit of the motor.
FIG. 31 is a characteristic diagram showing the discharge characteristics of various secondary batteries.

FIG. 30 shows an example of road surface traveling state and ON/OFF states of the two relay sections 200, 250. In the case where the traveling road surface is ascending, the coil cut relay section 200 of FIG. 29 is turned ON, and the charge circuit relay, section 250 is turned OFF. In the case where the traveling road surface is flat so that inertia traveling can be carried out, the coil cut relay section 200 is turned OFF and the charge circuit relay section 250 is also turned OFF.

In the case where the traveling road surface is descending, the coil cut relay section 200 is turned OFF and the charge circuit relay section 250 is turned ON. Thus, in the case where the traveling road surface is descending, the motor 31 functions as a generator by descending travel of the motor-operated bicycle. Namely, since the rotor RT of the motor 31 shown in FIG. 16 rotates relative to the stator ST with rotation of the rear wheel 17 as shown in FIG. 12, induced (induction) currents take place in the coils C1, C2, C3 of the iron core 53. Accordingly, the induced current when the motor 31 functions as a generator can be stored in the secondary battery 40 via the charge circuit 300 for the battery through the charge circuit relay section 250. In this example, in the operation of the motor-operated bicycle 1000 which will be described later, in the state where the traveling road surface is descending and the rear brake lever 12b is operated (manipulated) so that the rear brake sensor 140 is turned ON, the charge circuit relay section 250 is turned ON. Thus, charge operation is carried out.

By constituting the motor-operated bicycle in this way, it is possible to increase storage capacity of the secondary battery 40 while traveling. Thus, traveling of longer distance can be carried out.

The secondary battery 40 used in the motor-operated bicycle according to this invention will now be described.

As the secondary battery 40 used here, lithium ion battery is used. This lithium ion battery is a secondary battery including an anode consisting of carbon material in which doping/undoping of lithium is permitted and a cathode consisting of compound oxide of lithium and transition metal, and using non-aqueous electrolytic solution in which electrolyte is added to non-aqueous solvent.

FIG. 31 shows discharge characteristics of the lithium ion battery, the lead battery and the nickel-cadmium battery. The ordinate of FIG. 31 indicates voltage of the battery and the abscissor indicates passage of time. The discharge characteristic of the lithium ion battery is such that particularly when the battery capacity becomes less, the voltage is lowered with relatively great gradient with the passage of time. Further, the initial voltage of the lithium ion battery is a relatively high voltage which is 4V or more. Even if the voltage is lowered, the voltage obtained is not less than about 3V. On the contrary, in the case of the lead battery, the initial voltage is about 2V. The voltage is not so varied with the passage of time. The nickel-cadmium battery has the initial voltage of the order of 1V. Similarly, there is less change in voltage. Accordingly, the lithium ion battery can easily grasp change of voltage by change with the passage of time particularly when the battery capacity becomes less as compared to other lead batteries or the nickel-cadmium battery. In this case, falling of its voltage is substantially proportional to the remaining quantity of the battery within the range from the initial voltage, e.g., 4.2V to about 2.7V of the final voltage of the lithium ion battery. For this reason, it is possible to easily carry out detection of the remaining capacity of the lithium ion battery.

Since such lithium ion battery has a high energy density, has a voltage higher than other secondary batteries as shown in FIG. 31, and does not include harmful material such as mercury, handling is easy.

The lithium ion battery includes, as shown in FIG. 32, a cathode 41a, an anode 42a, a collector 41 of +, a collector 42 of −, and a separator 43. These collectors 41, 42 and the separator 43 are disposed within an electrolytic solution (electrolyte) 45 of a vessel 44. Lithium ions 46 move toward the anode 42a side which is the collector 42 of − through the separator 43. Thus, charge operation is carried out. On the contrary, when lithium ions 46 move toward the cathode 41a side through the separator 43 from the anode 42a, discharge operation takes place.

Figure 33:
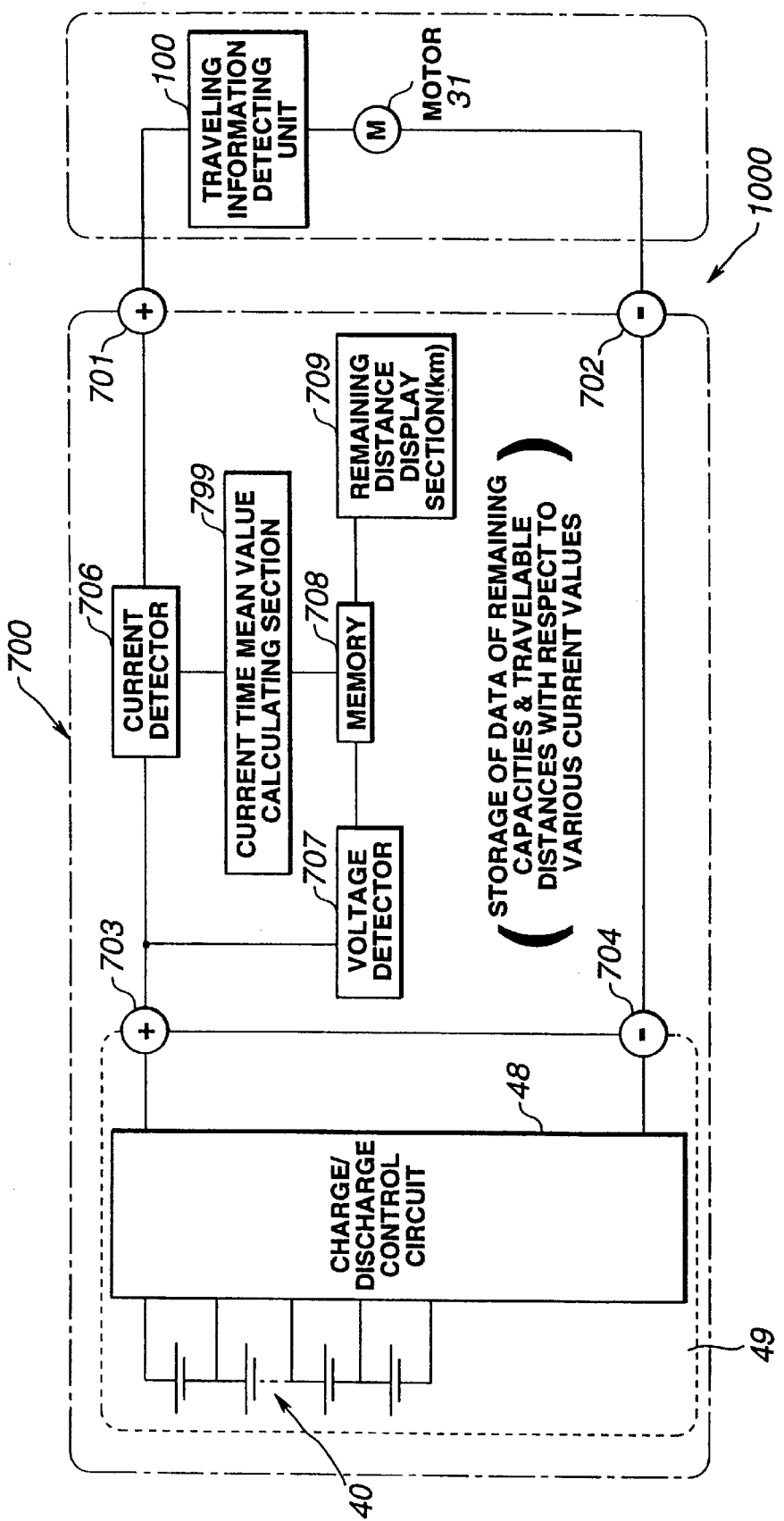
FIG. 33 is a view showing an example of remaining traveling distance display unit of the lithium ion battery.

FIG. 33 shows an example of a remaining traveling display unit 700 adapted for measuring the remaining capacity of the secondary battery 40 of the lithium ion battery to estimate the remaining traveling distance that the motor-operated bicycle of FIG. 1 can travel to display it.

This remaining traveling distance display unit 700 can be attached, e.g., in the vicinity of the handle or the attachment plate 21, etc. shown in FIG. 1. The remaining traveling distance display unit 700 is connected to the motor 31 and the traveling information detecting unit 100 through connection terminal 701, 702. This remaining traveling distance display unit 700 is connected to a charge discharge control circuit 48 of the secondary battery 40 through connection terminals 703, 704. A current detector 706 is provided between the connection terminals 703, 701. This current detector 706 detects values of currents flowing from the charge/discharge control circuit 48 toward the motor 31 side. These current values are delivered to a time mean (average) value calculating section 799 for current, at which current time mean (average) value is calculated. Then, the current time mean value is stored in a memory 708.

On the other hand, the connection terminal 703 is connected to a voltage detector 707. This voltage detector 707 detects voltage value of the secondary battery 40 obtained from the charge/discharge control circuit 48. As shown in FIG. 31, the voltage detector 707 detects a change of voltage within the range from about 4.2V of the initial voltage to about 2.7V of the final voltage. Voltage of the secondary battery 40 detected by the voltage detector 707 is stored into the memory 708. In the memory 708, a table indicating the relationship between the remaining capacities of the secondary battery 40 and travelable distances by the motor 31 with respect to current time mean values is stored. Accordingly, remaining distance is displayed on a remaining distance display section 709 on the basis of value of the table that the memory 708 has by the current time mean value and the value of voltage.

Figure 34:
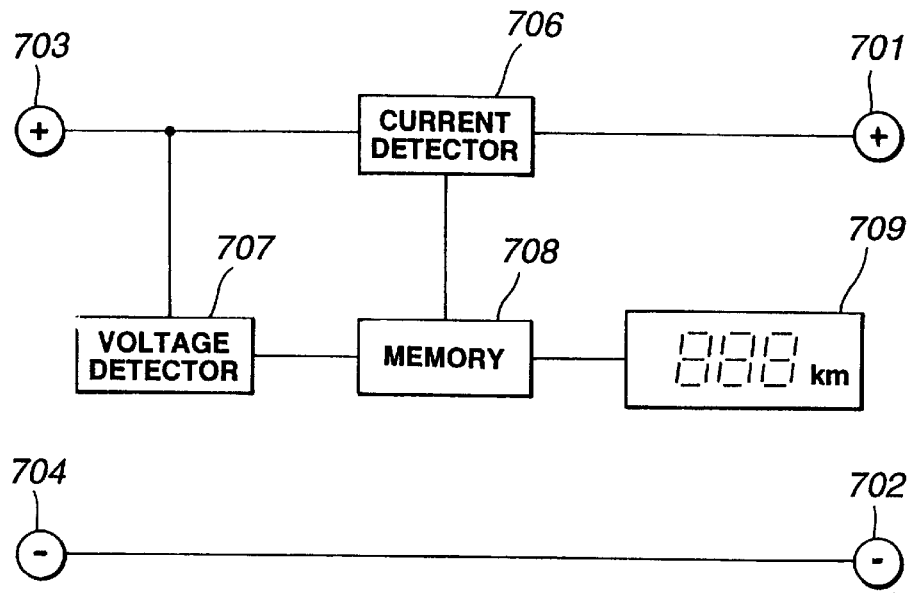
FIG. 34 is a view showing one example of the remaining quantity (distance) display section constituting the remaining traveling distance display unit.
Figure 35:
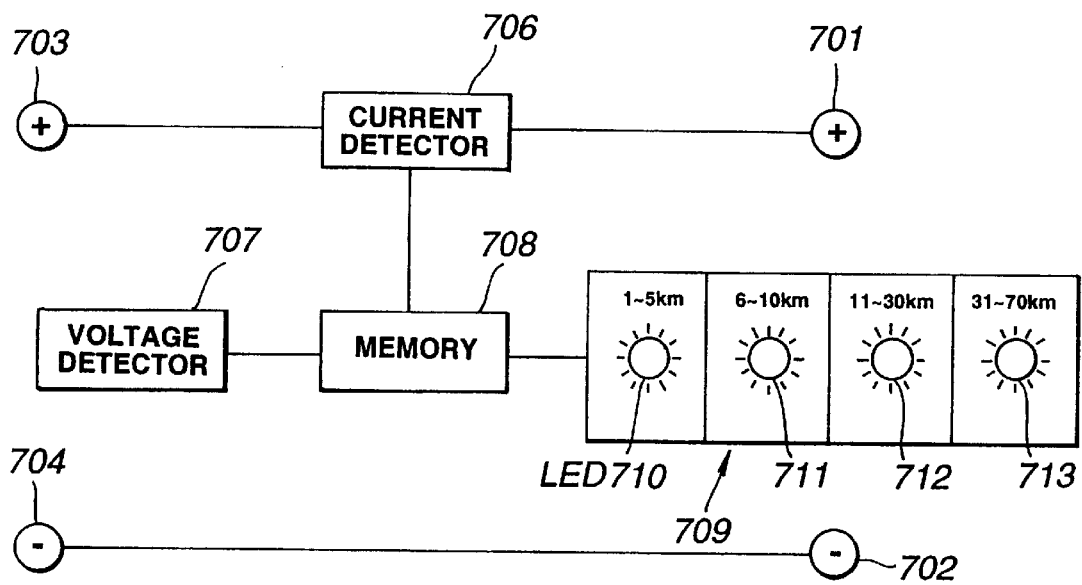
FIG. 35 is a view showing another example of the remaining quantity (distance) display section.

This remaining distance display section 709 can display the remaining traveling distance, e.g., in a digital fashion as shown in FIG. 34. Moreover, as shown in FIG. 35, the remaining distance display section 709 can also display, in an analog fashion, the remaining traveling distance by turning ON or turning OFF of four LEDs (Light Emitting Diodes) 710, 711, 712, 713. For example, when the LED 710 is turned ON, it can be displayed that the remaining traveling distance is 1~5 Km; when the LED 711 is turned ON, it can be displayed that the remaining traveling distance is 6~10 Km; when the LED 712 is turned ON, it can be displayed that the remaining traveling distance is 11~30 Km; and when the LED 713 is turned ON, it can be displayed that the remaining traveling distance is 31~70 Km.

In this case, if the secondary battery has a characteristic monotonously decreasing to such a degree that voltage can be detected with respect to the battery remaining capacity, any secondary battery except for the lithium ion battery may be used as the secondary battery 40.

Meanwhile, an analog/digital converter is used as the voltage detector 707. Therefore, it is possible to measure voltage of the secondary battery 40 within the range from full charge to completion of discharge of the secondary battery 40, i.e., within the range indicated by the curve of the lithium ion battery of FIG. 31. In the case where voltage that the voltage detector 707 detects is given to the memory 708 by using the analog/digital converter, it is preferable that voltage corresponding to the remaining capacity of the secondary battery 40 monotonously decreases at a value ⅟₁₀₀ times greater than voltage of the secondary battery 40 approximately within the range from 4.2V of full charge to 2.7V of completion of discharge.

In this example, a battery pack 49 consisting of the secondary battery 40 and the charge/discharge control circuit 48 shown in FIG. 33 can be detached from the remaining traveling distance display unit 700. In addition, the remaining traveling distance display unit 700 can be also detached through the connection terminals 701, 702 from the attachment plate 21 of the motor-operated bicycle 1000. Accordingly, even in the case where the remaining traveling display unit 700 is taken into the room as it is, it is possible to carry out remaining traveling distance display of the motor-operated bicycle 1000 by itself.

As described above, since the remaining traveling distance display unit 700 can be detached from the bicycle 1000 side through the connection terminals 701, 702 as shown in FIG. 33, this is convenient in that it is possible to carry out remaining traveling distance display of the motor-operated bicycle 1000 even in the course where the secondary battery 40 is being charged after detached from the bicycle 1000.

It is to be noted that, e.g., a pointer (type) voltage meter of the moving coil type, etc. except for the remaining distance display unit shown in FIGS. 34 and 35 may be used as the remaining distance display unit 709. Further, the remaining distance display unit 709 may display the remaining capacity itself of the secondary battery 40 in addition to the remaining distance.

The operation of the above-described motor-operated bicycle 1000 will now be described.

Figure 36:
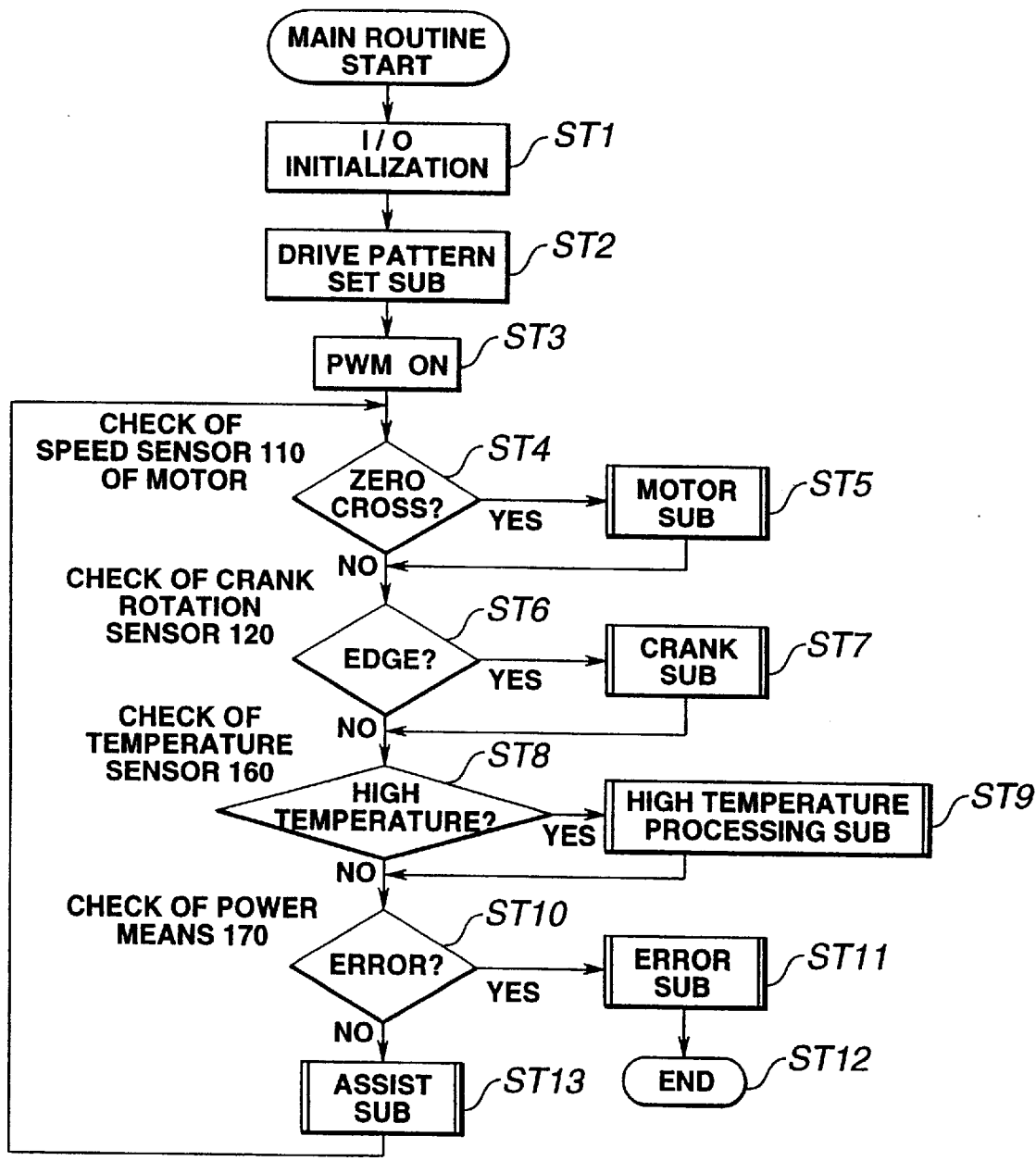
FIG. 36 is a flow chart showing the main routine of the motor-operated bicycle according to this invention.

FIG. 36 is the main routine showing the operation of the motor-operated bicycle 1000 shown in FIG. 1. In FIG. 36, when the main routine starts, the central processing circuit 101 carries out initialization of the digital input/output section 102 and the PWM signal preparation logic section 109, etc., and initialization of other parts (circuit components) (step ST1).

Figure 37:
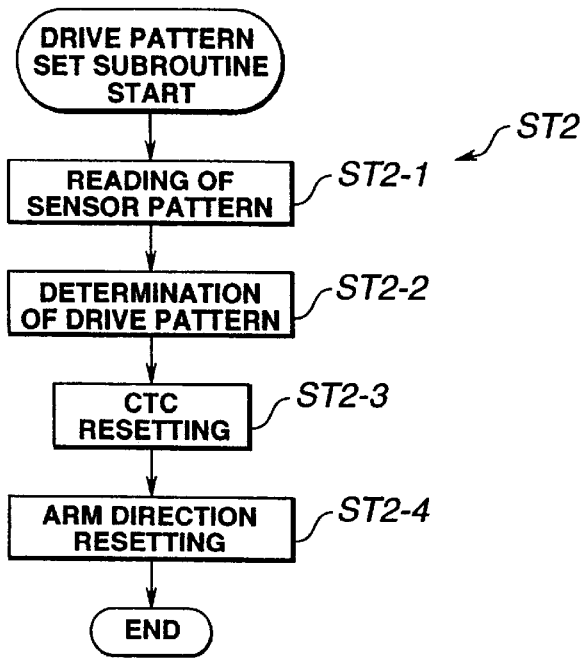
FIG. 37 is a flow chart showing drive pattern set sub-routine shown in FIG. 36.

At step ST2 of FIG. 36, the processing operation shifts to the set sub-routine of the drive pattern. This set sub-routine of the drive pattern is shown in FIG. 37. When the drive pattern set sub-routine starts, read operation of the sensor pattern is carried out at step ST2-1. This read operation of the sensor pattern means that three speed sensors 110 of FIG. 21 read the pattern of the mirror portions 67a of the reflection plate 67 of FIG. 22. By doing so, grasp (recognition) of the positional relationship between the magnet 56 and the coils C1, C2, C3 of the motor 31 is carried out.

At step ST2-2 of FIG. 37, drive pattern of the motor 31 is determined. In this determination of the drive pattern, the speed sensors 110 of FIG. 21 reads the pattern of the reflection plate 67 to thereby determine the following fact. Namely, since energization pattern of the coils for correctly rotating the motor 31 is univocally determined in correspondence with the output pattern of this speed sensor as shown in FIG. 24, the above-mentioned determination means that such energization pattern is set.

At step ST2-3, re-setting of CTC is carried out. This CTC is counters (counter units) 105a to 105f, and 105k constituting the PWM signal preparation logic section 109.

At step ST2-4, re-setting in the arm direction is carried out. Re-setting in the arm-direction is to set any one of modules of the power stage 170 of the three-phase motor 31 to which the PWM control signal is inputted.

When the drive pattern set sub-routine shown in FIG. 37 is completed, the processing operation returns to the step ST3 of FIG. 36 to start preparation of PWM control of the motor 31 shown in FIG. 2.

At step ST4 of FIG. 36, check of zero cross points ZC in FIG. 23 of the three speed sensors 110 shown in FIG. 21 is carried out. In the case where a check of the zero cross points is carried out, the processing operation shifts to the sub-routine of the motor of step ST5 of FIG. 38. In the case where no check of the speed sensors 110 of the motor 31 is carried out, the check of the crank rotation sensor 120 disposed with respect to the crank 14 shown in FIG. 13 is carried out.

Figure 38:
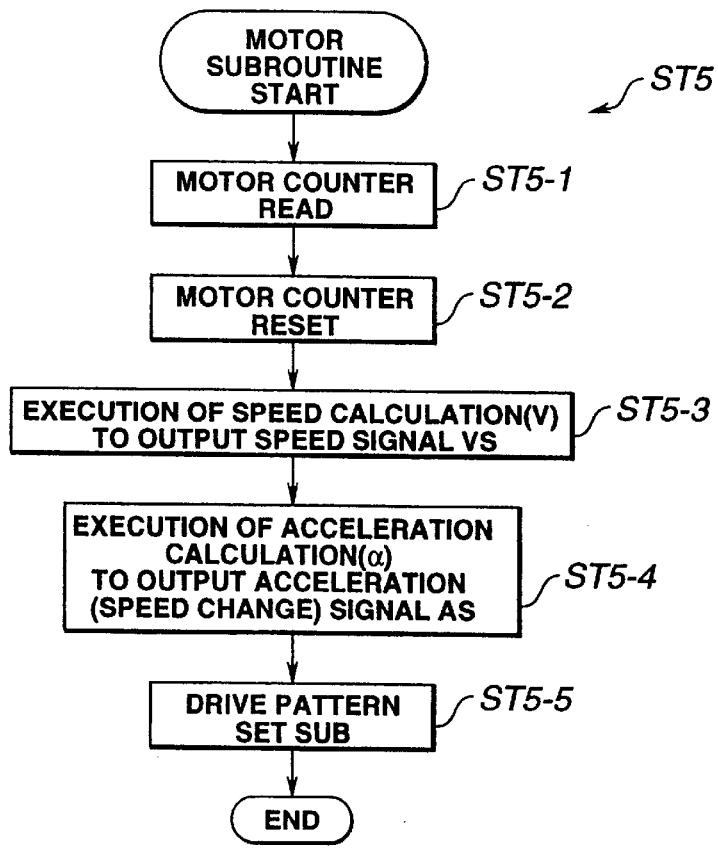
FIG. 38 is a flow chart showing the motor sub-routine shown in FIG. 36.

At step ST5-1 of FIG. 38, the speed sensor shown in FIG. 21 detects the mirror portion 67a shown in FIG. 22. In response to the detection signal of the speed sensor 110, the counter 103 is reset through the digital input/output section 102 shown in FIG. 2. Thus, at step ST5-3 and step ST5-4, the central processing circuit 101 carries out speed (velocity) calculation (V) to prepare speed signal VS, and carries out acceleration calculation (A) to prepare acceleration signal AS as speed change signal. At step ST5-5 of FIG. 38, the processing operation returns to the drive pattern set sub-routine shown in FIG. 37 to carry out a predetermined processing of the drive pattern sub routine ST2.

The reason why the processing operation shifts to the drive pattern sub-routine ST2 as stated above is that since the pattern of output signal of the speed sensor 110 is switched at the zero cross ZC point shown in FIG. 23, it is necessary to switch the energization pattern of the coils as shown in FIG. 24.

Figure 39:
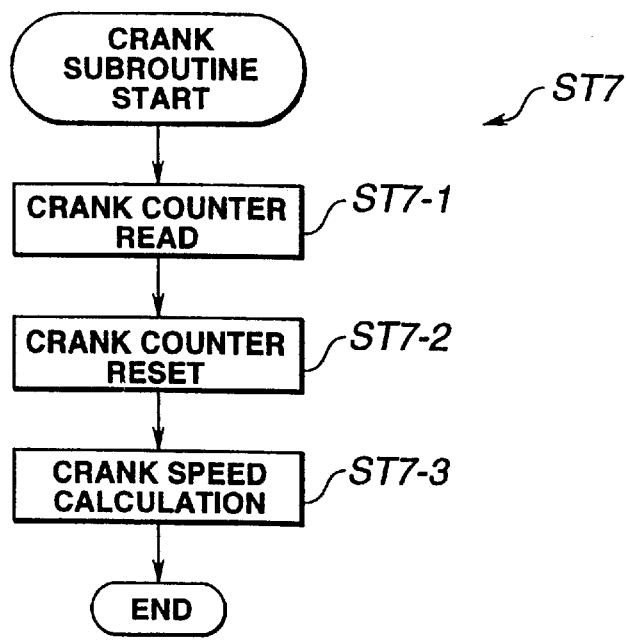
FIG. 39 is flow chart showing crank sub-routine shown in FIG. 36.

In the case where check of the rotation sensor 120 of the crank 14 shown in FIG. 13 is carried out at step ST6 of FIG. 36, the processing operation shifts to the crank sub routine of step ST7. This crank sub routine ST7 is shown in FIG. 39. At step ST7-1, the crank rotation sensor 120 shown in FIG. 13 reads the mirror portion 122 with rotation of the crank 14. The data thus read is inputted to the digital input/output section 102 shown in FIG. 2. The counter 103 counts it. At step ST7-2 of FIG. 39, the counter 103 is reset.

Further, at step ST7-3 of FIG. 39, crank (rotation) speed when the crank 14 shown in FIG. 13 rotates is calculated on the basis of the above-mentioned count value. Thereafter, the processing operation shifts to the step ST8.

At step ST8 of FIG. 36, the temperature sensor 160 of FIG. 21 checks temperature of the motor 31. In the case where the value that this temperature sensor 160 detects is higher than a predetermined temperature, the processing operation shifts to the high temperature processing sub-routine of step ST9 of FIG. 36.

Figure 40:
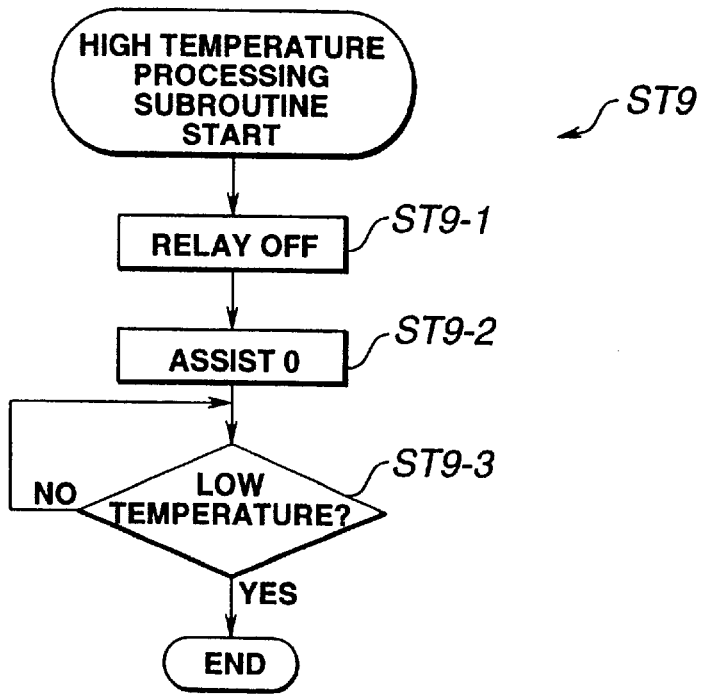
FIG. 40 is a flow chart showing the high temperature processing sub-routine shown in FIG. 36.
Figure 41:
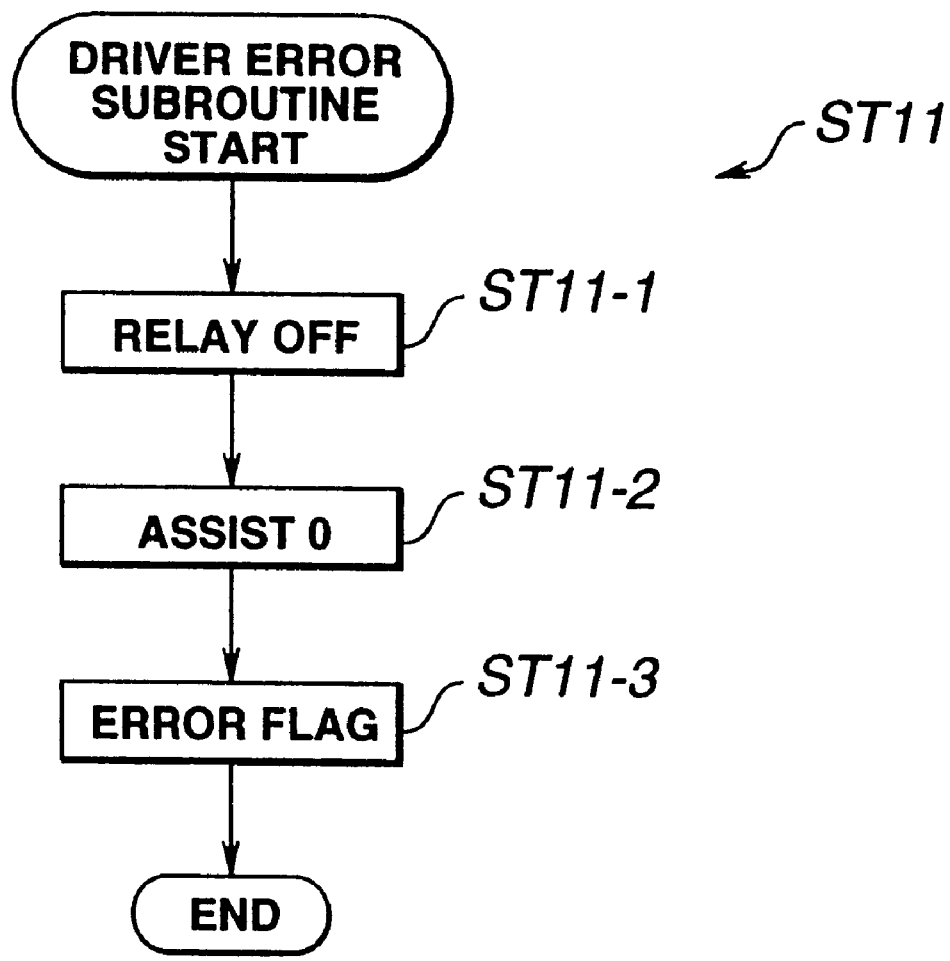
FIG. 41 is a flow chart showing the driver error sub-routine shown in FIG. 36.

The high temperature processing sub-routine ST9 is shown in FIG. 40. In this case, at step ST9-1, the central processing circuit 101 cuts off the coil cut relay section 200 to thereby stop energization to the motor 31 of the power stage 170. Thus, in the motor-operated bicycle 1000, assist of driving force by the motor 31 becomes equal to zero as indicated by ST9-2. In the case where temperature that the temperature sensor 160 of FIG. 21 detects is lower than the predetermined temperature at step ST9-3, the processing operation shifts to step ST10 of FIG. 36.

At the step ST10, operation check of the power stage 170 of FIG. 2 is carried out. If the power stage 170 outputs error signal 170e of FIG. 2 to the digital input/output section 102, the processing operation by the central processing circuit 101 shifts to the error sub-routine of step ST11 of FIG. 4. In this case, the coil cut relay section 200 of FIG. 15 is turned OFF as indicated by step ST11-1 to thereby allow assist of driving force (power) of the motor-operated bicycle 1000 by the motor 31 to be zero (0) as indicated by step ST11-2. Then, at step ST11-3, error flag is raised (set). At step ST12 of FIG. 36, the entire operation of the system is completed.

Figure 42:
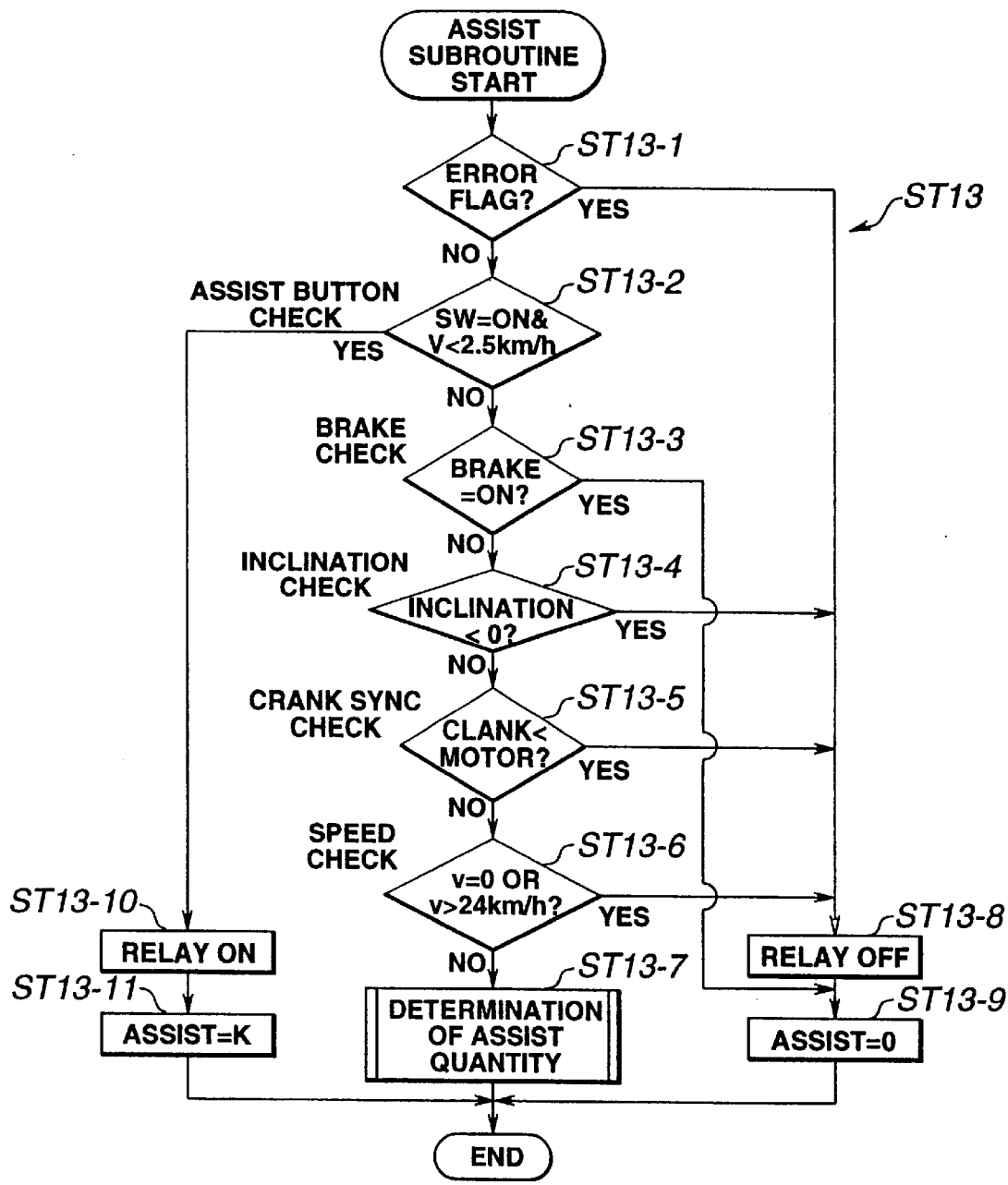
FIG. 42 is a flow chart showing the assist sub-routine shown in FIG. 36.

On the other hand, in the case where error of the power stage 170 is not detected at the step ST10 of FIG. 36, the processing operation enters assist sub-routine ST13 shown in FIG. 42.

In this assist sub-routine ST13, in the case where error flag is raised (set) at step ST13-1, the coil cut relay section 200 shown in FIG. 15 is turned OFF at step ST13-8 to thereby allow assist of driving force (power) of the motor 31 to be zero (0) at step ST13-9 thus to complete the operation.

Moreover, in the case where error flag is not raised (set) at the step ST13-1 shown in FIG. 42, processing of the steps ST13-2 to ST13-7 shown in FIG. 42 are carried out.

In the case where the driver allows the drive force assist button 180 shown in FIG. 2 to be in ON state and the speed of the motor-operated bicycle 1000 is a speed lower than, e.g., 2.5 Km/h at step ST13-2, the coil cut relay section 200 shown in FIG. 15 is turned ON at step ST13-10 to allow assist quantity of driving force to be equal to the fixed value K at step ST13-11. Namely, it is supposed that in such states where driver walks while pushing the motoroperated bicycle 1000, the speed may be lower than 2.5 Km per hour. In such cases, the coil cut relay section 200 shown in FIG. 15 is turned ON, whereby the motor 31 applies an assist quantity of a predetermined driving force to the motor-operated bicycle 1000. Thus, the driver can walk while easily pushing the motor-operated bicycle 1000 by a relatively small force.

In the case where speed of the motor-operated bicycle 1000 is 2.5 Km/h or more at step ST13-2 of FIG. 42, a check of the brake is performed out at step ST13-3. In this check of the brake, in the case where driver operates the front brake lever 12a or the rear brake lever 12b of FIG. 6, at least one signal of the front brake sensor 130 and the rear brake sensor 140 of FIG. 2 is given to the digital input/output section 102.

Accordingly, the central processing circuit 101 can check whether or not the driver is braking. In the case where either brake is applied, an assist quantity of driving force of the motor 31 is zero (0) at step ST13-9.

Moreover, in the case where the brake is not applied, the processing operation shifts to the inclination check of step ST13-4. The inclination sensor of FIGS. 8 and 9 carries out the inclination check. When the inclination is below zero (0), it is judged that the motor-operated bicycle 1000 does not travel on the flat surface, but travels on the downhill. Accordingly, the central processing circuit 101 allows the coil cut relay section 200 to be turned OFF at step ST13-8 of FIG. 42 to allow an assist quantity of the driving force of the motor 31 to be zero at step ST13-9.

When the angle is zero (0) or more as the result of a check of inclination, the central processing circuit 101 judges that the corresponding road surface is a flat road or a rising hill.

Thus, the processing operation shifts from step ST13-4 to step ST13-5 to perform a synchronization check of rotation of the crank. Namely, whether or not the driver operates and rotates the crank shown in FIGS. 12 and 13 by leg-power (step-on) force is discriminated. As a result, in the case where the number of rotations of the motor 31 is greater than the number of rotations of the crank 14, the central processing circuit 101 allows the coil cut relay section 200 to be turned OFF at step ST13-8 on the basis of the judgment that an assist of driving force by the motor 31 is unnecessary to allow the assist quantity of driving force to be zero (0).

Moreover, in the case where rotation of the motor 31 is synchronous with rotation of the crank 14, or rotation (speed) of the crank 14 is higher than rotation (speed) of the motor 31, the processing operation shifts to step ST13-6 to carry out a check of the speed of the motor-operated bicycle 1000. In this example, the detection of the number of rotations of the motor 31 is performed by the speed sensor 110 shown in FIG. 21 and the reflection plate 67 shown in FIG. 22, and the detection of the number of rotations of the crank 14 is performed by the crank rotation sensor 120 and the reflection plate 121 shown in FIG. 13.

In this example, the case where rotation (speed) of the crank 14 is higher than rotation (speed) of the motor 31 means the case where rotation (speed) of the crank 14 is above rotation (speed) of the motor 31 at a very small time interval (period) such as the time when driver begins to step on the pedals, etc.

In the speed check of the step ST13-6 of FIG. 42, in the case where speed of the motor-operated bicycle 1000 is higher than 0 or 24 Km/h, the central processing circuit 101 shown in FIG. 15 allows the coil cut relay section 200 to be turned OFF on the basis of the judgment that an assist of the driving force by the motor 31 is unnecessary to allow the assist quantity of driving force to be zero (0).

On the other hand, in the case where the motor-operated bicycle is assumed to travel at a speed which is equal to 24 Km/h or speed which is lower than that and is not equal to zero (0), e.g., 10 Km/h, the processing operation shifts to the sub-routine which calculates assist quantity of driving force at step ST13-7. It is to be noted that assist quantity of driving force can be calculated by speed and acceleration of the motor-operated bicycle 1000 and the inclination of the road surface.

Figure 43:
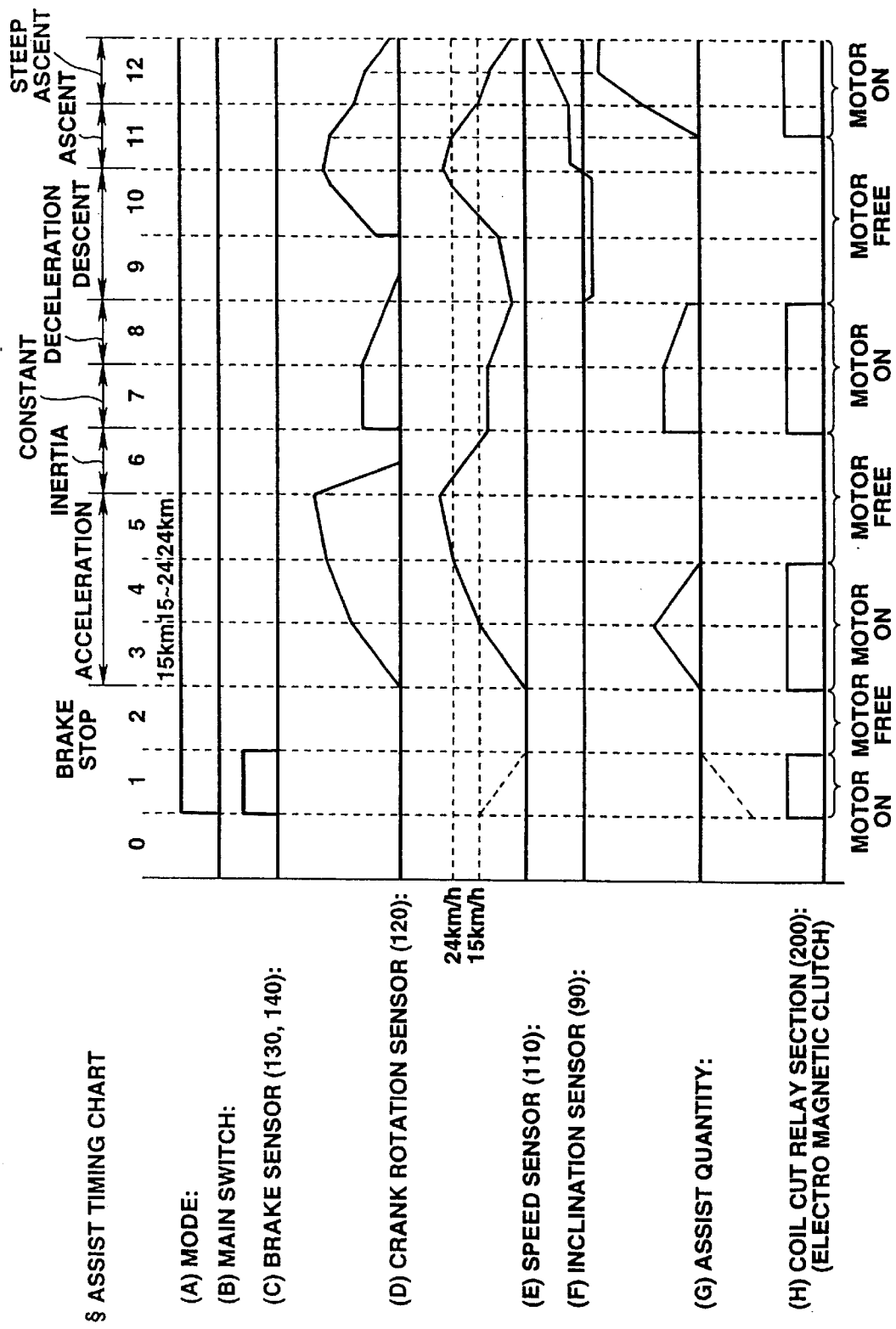
FIG. 43 is a view showing an example of the timing of the supply of the assist driving force from the motor.

FIG. 43 is a view showing an example of the timing of the assist of the driving force by the motor 31 in the case where the motor-operated bicycle 1000 shown in FIG. 1 travels in various modes.

In FIG. 43, as mode (A), there are modes labeled 0 to 12. As shown in FIG. 44, the mode 0 indicates the initial state, the mode 1 indicates the brake state, the mode 2 indicates a stop state, the modes 3 to 5 indicate an acceleration traveling state, the mode 6 indicates an inertia traveling state, the mode 7 indicates a constant traveling state, the mode 8 indicates a deceleration traveling state, the modes 9 and 10 indicate a descending traveling state, and the modes 11 and 12 indicate an ascending traveling state. (B) to (H) of FIG. 43 indicate operation states of various portions in correspondence with the mode (A).

Initially, in the initial state of the mode 0, the main switch is in an OFF state or the secondary battery 40 shown in FIG. 15 is in a battery dead state, and the motor 31 is in a free state the, driver can move the motor-operated bicycle 1000 by moving it by hand, or he can ride as an ordinary bicycle. The assist quantity of driving force from the motor 31 is equal to zero (0).

In the brake state of the mode 1, even if the main switch is turned ON as shown in FIG. 43(B), since the driver operates the front brake lever 12a or the rear brake lever 12b shown in FIG. 5, the front brake sensor 130 or the rear brake sensor 140 is preferential to other sensors. For this reason, the assist quantity of driving force of FIG. 43(G) is equal to zero (0). At this time, there may be employed, e.g., an approach to allow the assist quantity of driving force of the motor 31 to be negative, i.e., to allow the motor to be in inverse torque mode to utilize the motor 31 as an electromagnetic brake to enhance the braking effect.

In the mode 2 of FIG. 43, since the motor-operated bicycle 1000 is in a stopped state and the motor 31 is in a free state, the user can freely (desirably) move the motor-operated bicycle by hand. The modes 3 to 5 of FIG. 43 indicate the acceleration traveling state. Since the mode 3 is the acceleration state (less than 15 Km/h) where the motor 31 and the crank 14 are synchronized with each other, the motor 31 performs an assist of driving force by one half (½) of necessary work load.

In the mode 4, the motor 31 and the crank are synchronized with each other and the motor-operated bicycle is in an acceleration state within the range from 15 to 24 Km/h. The ratio of the assist quantity of the driving force of the motor 31 gradually decreases from 1/2.

In the mode 5, the motor 31 and the crank 14 are synchronized with each other and the motor-operated bicycle is in an acceleration state equal to 24 Km/h or more. The assist quantity of the driving force to the rear wheel by the motor 31 is eliminated, whereby energization to the motor 31 is not performed.

In the mode 6 of FIG. 44, in the state where the motor 31 and the crank 14 are not synchronized with each other, i.e., in the case where the motor-operated bicycle carries out inertia traveling such that the driver stops pedaling, the assist quantity of driving force of the motor 31 is eliminated irrespective of speed, whereby energization to the motor 31 is not performed.

In the mode 7, the motor-operated bicycle is in a constant speed state where the motor 31 and the crank 14 are synchronized with each other. The motor 31 performs an assist of driving force similar to the acceleration traveling state in the modes 3 to 5.

In the mode 8, the motor-operated bicycle is in the deceleration state where the motor 31 and the crank 14 are synchronized with each other. In this manner, the motor 31 performs assist of driving force similarly to the acceleration traveling state in the modes 3 to 5.

The modes 9 and 10 indicate the descending traveling state.

In this mode, the motor-operated bicycle 1000 travels on the downhill in the state where the motor 31 and the crank 14 are not synchronized with each other. Accordingly, the assist quantity of driving force of the motor 31 is equal to zero (0) irrespective of speed, and energization to the motor 31 is not performed. In the mode 10, the motor-operated bicycle is in the acceleration state where the motor 31 and the crank 14 are synchronized with each other, and travels on the downhill. Even in this case, the assist quantity of driving force of the motor 31 is equal to zero (0) irrespective of speed, and energization to the motor 31 is not performed.

In the modes 11 and 12, the motor-operated bicycle 1000 travels on a rising hill in the state where the motor 31 and the crank 14 are synchronized with each other. Accordingly, the assist quantity of driving force of the motor 31 corresponding to speed is multiplied by the coefficient of slope angle, and the assist quantity of predetermined driving force of the motor 31 is applied to the rear wheel 17.

In the mode 12, the motor-operated bicycle travels on a steep rising hill in the state where the motor 31 and the crank 14 are synchronized with each other. In this case, the slope angle coefficient is further increased. It is here noted that the assist quantity of driving force is limited by the characteristic of the motor 31.

It is to be noted that, in the case of a rising hill, even if the crank 14 is not temporarily synchronized with the motor 31, the assist of driving force of a quantity such that the motor 31 and the rear wheel 17 as a drive wheel are not stopped is continued.

In the modes 0 to 12 of FIG. 44, at the time of acceleration of the modes 3 to 5, the crank rotation sensor 120 of FIG. 43(D). detects the rotation speed of the crank in the state where driver steps on the pedal so that the motor-operated bicycle is accelerated. Moreover, also in the modes 6 to 12, the above-mentioned sensor 120 detects rotation speed of the crank. The speed sensor 110 of FIG. 43(E) detects the speed of the motor-operated bicycle 1000 in the modes 3 to 12. The inclination sensor 90 of FIG. 43(F) detects the inclination angle of the motor-operated bicycle 1000 at downhill and uphill of the modes 9 to 12. The assist quantity of driving force of FIG. 43(G) is given at the time of acceleration of the modes 3, 4, the modes 7, 8 and the modes 11, 12.

The coil cut relay section 200 of FIG. 43(H) controls the motor 31 so as to turn ON or OFF it in correspondence with the respective modes.

An example of the operation pattern of the motor-operated bicycle 1000 of FIG. 45 will now be described. FIG. 45(A) shows an example of the traveling pattern of the motor-operated bicycle 1000, and shows, as a more practical example, the flat road surface T1, the ascending road surface T2, the flat road surface T3, the descending road surface T4 and the flat road surface T5.

Figure 45:
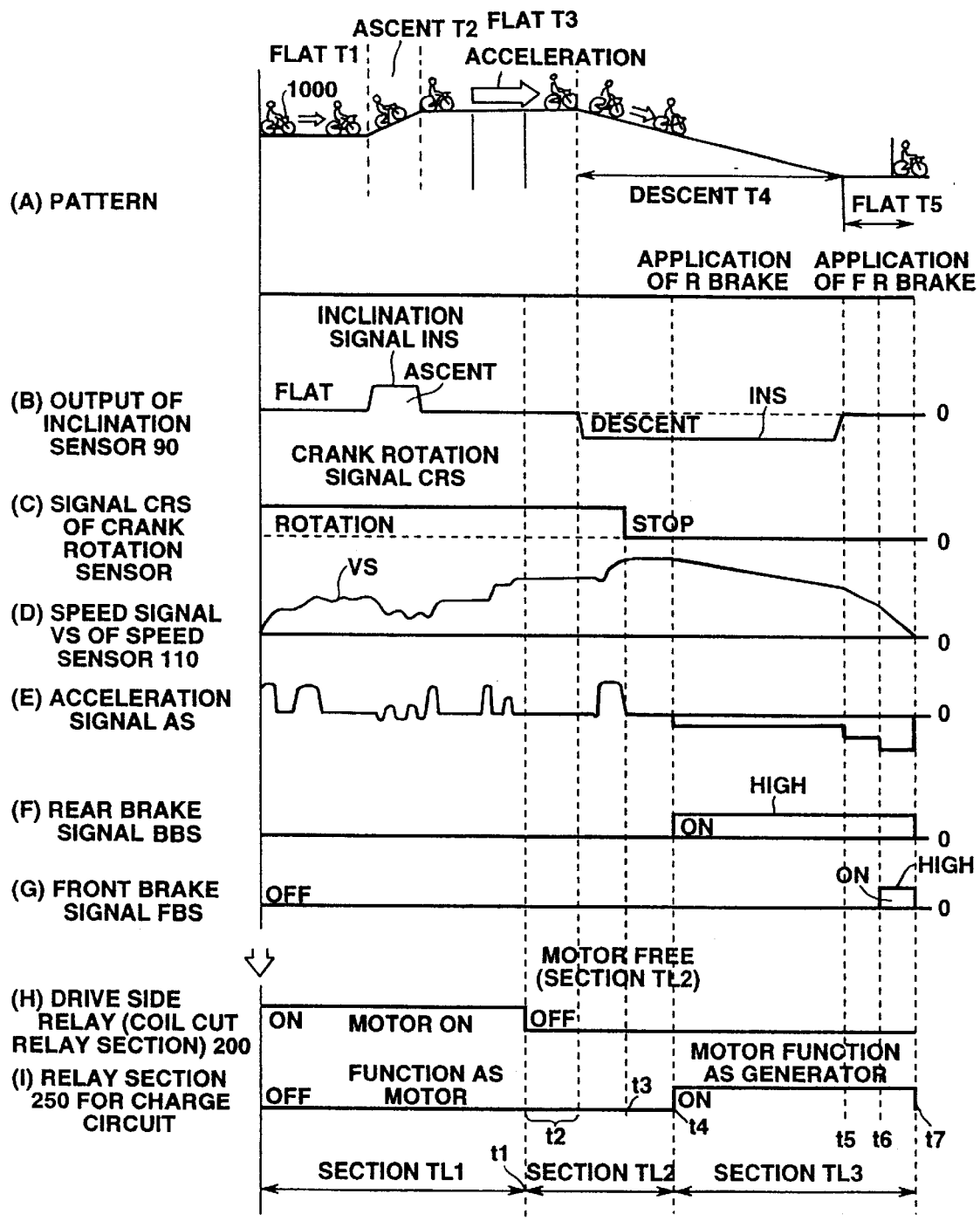
FIG. 45 is a view showing an example of the traveling pattern of the motor-operated bicycle according to this invention.
Figure 46:
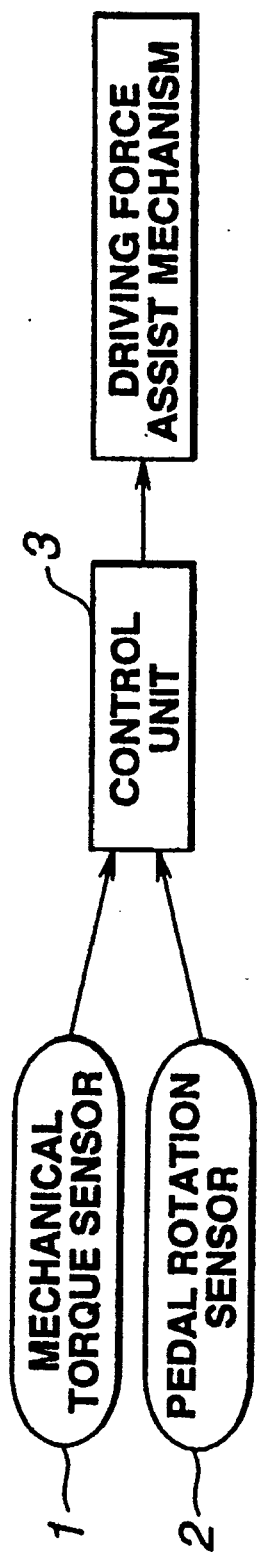
FIG. 46 is a block diagram showing the configuration of the conventional motor-operated bicycle.

FIG. 45(B) shows an inclination signal INS of the inclination sensor 90, and FIG. 45(C) shows a crank rotation signal CRS of the crank rotation sensor 120. FIG. 45 (D) shows a speed signal VS of the speed sensor 110. FIG. 45(E) shows a speed signal obtained from the speed sensor 110 and an acceleration signal AS obtained by differentiating it, and FIGS. 45(F), (G) show ON/OFF signals of the front brake sensor 130 and the rear brake sensor 140.

FIG. 45(H) shows an ON/OFF signal of the coil cut relay section (drive side relay) 200 of FIG. 15, and FIG. 45(I) shows an ON/OFF signal of the charge circuit relay section 250 of FIG. 45(I).

Moreover, in FIG. 45, the section from the initial position of the flat road surface T1 to the middle portion of the flat road surface T3 is indicated by the section TL1, the section from the middle portion of the flat road surface T3 to the middle portion of the descending road surface T4 is indicated by the section TL2, and the section from the middle portion of the descending road surface T4 to the position at which the motor-operated bicycle 1000 is stopped is indicated by the section TL3.

In the traveling pattern of the motor-operated bicycle 1000 as shown in FIG. 45, the respective portions become operative in a manner as described below.

When the motor-operated bicycle 1000 travels on the flat road surface T1 of the section TL1 of FIG. 45(A), the coil cut relay section 200 is turned ON. As a result, the motor 31 is driven so that an assist driving force is applied to the rear wheel 17. Since the corresponding road surface is the flat road surface T1, output of the inclination sensor 90 is equal to zero (0). Since the driver applies leg-power (step-on force) to the pedal of the motor-operated bicycle 1000, the crank rotation signal CRS is outputted. The speed signal VS of the speed sensor 110 and the acceleration signal AS based thereon are delivered to the central processing circuit 101 of FIG. 2 in dependency upon the traveling state.

When the motor-operated bicycle 1000 travels from the flat road surface T1 to the ascending road surface T2, pedaling of driver is increased. At this time, the inclination sensor 90 outputs an inclination signal INS indicating that the corresponding road surface is ascending and speed signal VS of the speed sensor 110 is slightly lowered. Followed by this, the acceleration signal AS is changed (fluctuated).

When the motor-operated bicycle 1000 shifts (moves) from the ascending road surface T2 to the flat road surface T3, pedaling of the driver is decreased. When the driver then increases pedaling, the motor-operated bicycle 1000 is accelerated. Thus, the speed signal VS of the speed sensor 110 is increased. When the driver pedals faster from the middle portion of the flat road surface T3, the speed per hour of the motor-operated bicycle 1000 is 24 Km/h or more. For this reason, the coil cut relay section 200 of the motor 31 is turned OFF at time point t1 of the end of the section TL1. Namely, for a time period t2 entering from the section TL1 to the section TL2, the coil cut relay section 200 is in an OFF state. Accordingly, drive of the motor 31 is stopped. Thus, there results no assist of the driving force to the rear wheel 17.

When the motor-operated bicycle 1000 travels along the descending road surface T4 shown in FIG. 45(A), the inclination sensor 90 outputs a descending inclination signal INS, and the driver stops pedaling. Accordingly, the signal CRS of the crank rotation sensor 120 becomes equal to zero (0) at time point t3. When the motor-operated bicycle 1000 travels along the middle portion of the descending road surface T4, the driver applies a brake to the rear wheel 17 at time point t4. Thus, the value of the speed signal VS of the speed sensor 110 is gradually lowered. As a result, the acceleration signal AS indicates minus. At this time point t4, the charge circuit relay section 250 shown in FIG. 45(I) is turned ON by command from the central processing circuit 101. Namely, since the charge circuit relay section 250 is turned ON at the time point t4 in the state where the coil cut relay section 200 of FIG. 2 is turned OFF, the motor 31 functions as a generator. Thus, the motor 31 starts a charge operation with respect to the secondary battery 40 of FIG. 15.

At the time point t5 when the motor-operated bicycle 1000 has completely descended on the descending road surface T4 and travels along the flat road surface T5 for a second time, the inclination signal INS of the inclination sensor 90 becomes equal to zero (0), and the value of the speed signal VS of the speed sensor 110 is further reduced. At time point t6 of the flat road surface T5, the driver applies the brake to both the front wheel 16 and the rear wheel 17 as shown in FIGS. 45(F), (G). Thus, the motor-operated bicycle is stopped at time point t7.

As stated above, since an assist of driving force of the motor 31 is required at the section TL1, the coil cut relay section 200 is turned ON. As a result, the motor 31 is driven. Thus, the assistant driving force is applied to the rear wheel 17.

Since the assist of driving force to the rear wheel 17 by the motor 31 becomes unnecessary when the motor-operated bicycle comes to the section TL2, the coil cut relay section 200 is turned OFF. Thus, regenerative current of the motor 31 does not flow. Accordingly, it is not prevented that the motor-operated bicycle 1000 travels by inertia. Further, since the section TL3 is a descending hill, the motor-operated bicycle 1000 travels by self weight. For this reason, the motor 31 is permitted to function as a generator. Thus, the charge operation is performed with respect to the secondary battery 40.

It is to be noted that the case where the motor 31 is caused to be driven at the section TL1 to apply assistant driving force to the rear wheel 17 is the case where the speed per hour of the motor-operated bicycle 1000 is less than a set speed, e.g., 24 Km/h. At this time, it is necessary that brakes of the front wheel 16 and the rear wheel 17 are in an OFF state, signal CRS of the crank rotation sensor 120 is outputted, and the corresponding road surface is an ascending hill or a flat road surface.

Moreover, in the section TL3, when the rear brake is turned ON in the state where the coil cut relay section 200 is turned OFF, the rear brake sensor 140 is turned ON. As a result, rear brake signal TBS is delivered to the central processing circuit 101. Thus, the central processing circuit 101 outputs a charge control signal PSS to allow the charge circuit relay section 250 to be turned ON. As a result, the motor 31 acts (functions) as a generator. Thus, it is possible to perform a regenerative brake and charge operation.

Regenerative brake quantity at the section TL3 can be controlled by the current of regeneration of the motor 31 acting as generator. For example, there may be also employed an approach to set angles of potentiometers 130a, 140a shown in FIG. 7 by the angle of the front brake lever 12a or the rear brake lever 12b of FIG. 5 to thereby permit control of current value of regeneration.

Further, when the front brake sensor 130 or the rear brake sensor 140 (i.e., micro switch) is turned ON as shown in FIG. 6, its brake quantity is detected from its deceleration state (negative acceleration information) to apply, e.g., brake force of ‰ corresponding thereto to the motor 31 acting (functioning) as the generator, thereby making it possible to smoothly apply the assistant force of the motor-operated bicycle brake.

An approach may be also employed to control the motor 31 utilized as a generator so that when the brake is applied to a degree such that deceleration is not carried out on the downhill, such a brake quantity to maintain speed at that time point is provided. At this time, the traveling information detecting unit 100 detects by the inclination sensor, the brake sensor or the acceleration information, etc. whether the brake is applied to such a degree that acceleration is not performed.

Moreover, when the motor 31 is not used for supply of an assistant driving force, the coil cut relay section 200 shown in FIG. 15 is turned OFF, thereby permitting the motor 31 not to be a traveling load when it does not serve as a supply source of the assistant driving force.

The regenerative current of the motor 31 acting as the generator varies not only by the voltage of the generating side by speed, but also by the remaining capacity of the secondary battery 40. In view of the above, in order to obtain a stable control force, an approach may be employed to allow the current required for charging of the regenerative current to flow in the secondary battery 40 by remaining capacity information from the CPU included in the secondary battery 40 to consume remaining the regenerative current at other portions or supplementary charge it.

In this example, the rear brake is used for the purpose of the smooth deceleration of the motor-operated bicycle, and the front brake is used for the purpose of stopping the motor-operated bicycle. Thus, a strong brake force of the inverse torque mode is quickly generated at the rear wheel or the front wheel, thus making it possible to realize a stable traveling stop operation.

In the motor-operated bicycle according to this invention, the traveling information detecting unit 100 recognizes the traveling state on the basis of speed information, i.e., speed signal VS obtained from the speed sensor 110 of the motor 31 integrally attached to the rear wheel 17 which constitutes the rotating portion of the bicycle. In this case, since the speed sensor 110 is not in contact with the rotor RT of the motor 31 rotating in one body with the rear wheel 17, there is no possibility that a mechanical addition is made with respect to the rotor RT of the motor in order to obtain speed information.

Further, the drive force assist mechanism estimates an acceleration signal AS, which is obtained from the traveling information detecting unit 100 which recognizers the traveling state to assist the driving force and calculates an acceleration based on the second sensed speed (see FIGS. 38–44 and 45). From this fact, unlike the conventional system in which the mechanical torque sensor is used to calculate one half (½) of the torque of to pedaling by the driver to apply an assistant driving force which is one half (½) of that pedaling force from the motor, there is employed in this invention such a system that the motor 31 is driven in correspondence with the current traveling state and faithfully with respect to the driver's intention in the state where such mechanical addition is not made with respect to the rotating portions of the motor-operated bicycle, thus making it possible to deliver an assistant driving force to the rear wheel 17 as the drive wheel.

Further, as shown in FIGS. 16 and 17, the motor of the direct coupling type is used with respect to the rear wheel 17. Namely, the stator ST of the motor 31 is integrally provided directly at the shaft 51 corresponding to the wheel shaft of the motor-operated bicycle 1000. Accordingly, in the motor-operated bicycle conventionally used, the driving force of the motor is transmitted to the rear wheel through the gear box. As a result, there were the problems that power transmission loss by gear takes place and/or the motor is large sized and is heavy in weight. However, the motor 31 according to this invention has solved these problems.

Further, the rotor RT of the motor 31 is positioned at the outside with respect to the stator ST, and the motor 31 is the outer rotor type motor. By using this outer rotor type motor, the rotor RT can be directly connected to the spokes 17*p* of the rear wheel 17. Thus, the structure is simplified and light-weight is realized.

In addition, when the drive coils of the stator of the motor are energized, the rotor rotates relative to the stator to move the moving apparatus. In this instance, even if the drive coils of the stator are heated, that heat is radiated through the stator holder 63 and the radiator 64 constituting the radiating means. Thus, failure or deterioration of the motor can be suppressed. In addition, even if the drive coils are heated in the case where the motor functions as the generator, that heat can be similarly radiated through the stator holder 63 and the radiator 64.

Particularly, if fins are provided at the radiator 64, its radiating efficiency can be further improved. If the radiator is forced into the stator side, it can be attached with ease. Further, fins provided at the radiator 64 are caused to be in parallel to the movement direction of the moving apparatus, thereby making it possible to efficiently cool the fins in movement. Since electric power supply lines for energizing the drive coils of the stator are connected to the drive coils through the radiator 64 of the stator side from the outside, drawing of the electric power supply lines is easy.

In the case where this invention is applied to the motor-operated bicycle, the term of the rotating portion is the concept indicating at least one of the rear wheel and the front wheel, or the concept including the crank in addition thereto.

In addition, this invention can be widely applied not only to the motor-operated bicycle as described above, but also to a moving apparatus such as a wheelchair, or carrying vehicle operated mainly by human power, or automotive vehicle as a toy or other vehicle toys, etc. In the case where this invention is applied to such a wheelchair or carrying vehicle, the rotating portion such as auxiliary wheel, etc. also constitutes the rotating portion of this invention.

While lithium ion battery capable of outputting high voltage and having excellent discharge characteristics is used as the secondary battery of the above-described motor-operated bicycle, other chargeable secondary batteries such as Ni-MH (Nickel-Metal halide) battery, etc. may be used.

Meanwhile, in the case where a lithium ion battery is used as the secondary battery, there may be employed a configuration as described below. For example, as shown in FIG. 33, the moving coil type pointer voltage meter may be used as the current detector 706, the voltage detector 707 or the remaining distance display section 709 to approximately display detection value by pointer on the scale display plate thus to permit driver to confirm current value or voltage value and remaining distance display by visual observation.

In addition, while the motor is disposed in correspondence with the wheel shaft of the rear wheel in the above-mentioned motor-operated bicycle, the motor may be directly disposed on the crank shaft or may be directly disposed on the front wheel.

As described above, since the moving apparatus according to this invention detects rotation speed of the rotating portion in a non-contact manner with respect to the rotating portion such as the wheel, etc. to detect the traveling state to deliver, from the driving force assist mechanism, an assistant driving force corresponding to speed change information that a person who operates the moving apparatus intends to give on the basis of the detected traveling information to perform traveling, even in the case where traveling by only human power becomes difficult, smooth traveling can be achieved.

Particularly, since detection of the traveling state is detected in a non-contact manner with respect to the rotating portion, it is possible to carry out detection of the traveling state without applying great load to the moving apparatus. Thus, traveling by only human power can be prevented from being impeded.

In addition, since the driving force assist mechanism is directly connected to the wheel, miniaturization can be made. Thus, a light-weight construction of the moving apparatus can be realized.

What is claimed is:

1. A moving apparatus provided with a driving force assist unit for additionally applying driving force to a drive wheel depending upon traveling information of the moving apparatus;

the moving apparatus comprising:

traveling information detecting means for detecting, in a non-contact manner, with respect to a rotating portion, the rotational speed of the rotating portion to detect the traveling information of the moving apparatus;

driving force assist means for applying to the drive wheel a driving force corresponding to a change in speed information which is detected on the basis of traveling information detected by the traveling information detecting means;

inclination detecting means for detecting inclination information of the moving apparatus;

constant speed detecting means for determining a constant speed traveling driving force required for maintaining a constant traveling speed on the basis of speed information detected by the traveling information detecting means and inclination information detected by the inclination detecting means;

acceleration detecting means for determining an acceleration driving force corresponding to the change in speed information which is detected on the basis of traveling information detected by the traveling information detecting means; and assistant driving force detecting means for determining an assistant driving force which is to be delivered by the driving force assist means on the basis of the constant speed traveling driving force determined by the constant speed detecting means and the acceleration driving force determined by the acceleration detecting means;

an electric power source for supplying electric power to the driving force assist means.

2. A moving apparatus as set forth in claim 1, and further comprising a brake mechanism for braking the moving apparatus, whereby when the brake mechanism is operated, the supply of electric power to the driving force assist means is stopped.

3. A moving apparatus as set forth in claim 1, and further comprising a rotational operation portion adapted to be operated by a driver, and said drive wheel is adapted so that when a rotation force of the rotational operation portion is transmitted thereto the drive wheel is rotated, whereby when the rotational speed of the drive wheel and the rotational speed of the rotational operation portion are synchronized with each other, or when the rotational speed of the rotational operation portion is greater than the synchronized rotational speed of the drive wheel, the driving force assist is carried out.

4. A moving apparatus as set forth in claim 1, wherein the electric power source is a chargeable battery.

5. A moving apparatus as set forth in claim 1, wherein when the drive wheel receives an external force, the driving force assist means functions as an electro-magnetic brake.

6. A movement control method for a moving apparatus provided with a manually-operated drive wheel, and a driving force assist unit for additionally applying driving force to the drive wheel depending upon traveling information, the movement control method comprising the steps of:

detecting, in a non-contact manner, with respect to a rotating portion, the rotational speed of the rotating portion to detect the traveling information of the moving apparatus;

detecting a driving force corresponding to a change in speed information which is detected on the basis of the detected traveling information;

applying the detected driving force to the drive wheel from the driving force assist means driven by an electric power source;

detecting inclination information of the moving apparatus by inclination detecting means;

determining a constant speed driving force required for maintaining a constant traveling speed by means of a constant speed detecting means on the basis of the change in speed information detected by the traveling information detecting means and inclination information detected by the inclination detecting means, determining an acceleration traveling driving force corresponding to speed change information by an acceleration detecting means which is detected on the basis of traveling information detected by the traveling information detecting means, and determining an assistant driving force by means of an assistant driving force detecting means to be delivered by the driving force assist means on the basis of the constant speed traveling driving force determined by the constant speed detecting means and the acceleration driving force determined by the acceleration detecting means.

7. A moving apparatus comprising:

a manually operated drive wheel;

an electric motor for additionally applying driving force to the drive wheel in addition to human power depending upon traveling information of the moving apparatus, traveling information detecting means for detecting, in a non-contact manner, with respect to a rotating portion the rotational speed of the rotating portion to detect the traveling information of the moving apparatus, driving force assist means for applying to the drive wheel a driving force corresponding to a change in speed information which is detected on the basis of traveling information detected by the traveling information detecting means;

an electric power source for supplying electric power to the driving force assist means;

inclination detecting means for detecting inclination information of the moving apparatus, constant speed detecting means for determining a constant speed traveling driving force required for maintaining a constant traveling speed on the basis of the change in speed information detected by the traveling information detecting means and inclination information detected by the inclination detecting means, acceleration detecting means for determining an acceleration traveling driving force corresponding to speed change information which is detected on the basis of traveling information of the moving apparatus detected by the traveling information detecting means, and assistant driving force detecting means for determining a assistant driving force which is to be delivered by the driving force assist means on the basis of the constant speed traveling driving force determined by the constant speed detecting means and the acceleration driving force determined by the acceleration detecting means;

a chargeable battery for driving the electric motor; and a remaining traveling distance display unit for detecting the voltage of the battery to detect the remaining capacity of the battery to display the remaining traveling distance of the moving apparatus on the basis of the detected remaining capacity.

8. A moving apparatus as set forth in claim 7, wherein the battery is detachably provided along with the remaining traveling distance display unit.

9. A moving apparatus provided with a drive wheel comprising:

a manually-operated wheel;

an electric motor for additionally applying a driving force to the drive wheel depending upon traveling information of the moving apparatus;

an electric power source for driving the electric motor;

traveling information detecting means for detecting, in a non-contact manner, with respect to a rotating portion, the rotational speed of the rotating portion to detect the traveling information of the moving apparatus, driving force assist means for applying to the drive wheel a driving force corresponding to a change in speed information which is detected on the basis of traveling information detected by the traveling information detecting means;

an electric power source for supplying electric power to the driving force assist means;

inclination detecting means for detecting inclination information of the moving apparatus, constant speed detecting means for determining a constant speed traveling driving force required for maintaining a constant traveling speed on the basis of the change in speed information detected by the traveling information detecting means and inclination information detected by the inclination detecting means, acceleration detecting means for determining acceleration traveling driving force corresponding to speed change information which is detected on the basis of traveling information of the moving apparatus detected by the traveling information detecting means, and assistant driving force detecting means for determining a assistant driving force which is to be delivered by the driving force assist means on the basis of the constant speed traveling driving force determined by the constant speed detecting means and the acceleration driving force determined by the acceleration detecting means; and function switching control means wherein when the road surface on which the moving apparatus moves requires an assist to the driving force for moving the moving apparatus, said function switching control means drives the electric motor, and when the road surface on which the moving apparatus moves does not require an assistant driving force for moving the moving apparatus, said function switching control means allows the electric motor to function as a generator.

10. A moving apparatus as set forth in claim 9, wherein where the road surface is up hill an assistant driving force for moving the moving apparatus is required, and where the road surface is generally flat or downhill an assistant driving force for moving the moving apparatus is not required.

\* \* \* \* \*